United States Patent
Shin

(10) Patent No.: US 11,481,004 B2
(45) Date of Patent: Oct. 25, 2022

(54) DISPLAY DEVICE

(71) Applicant: Samsung Display Co., Ltd., Yongin-si (KR)

(72) Inventor: Jaiku Shin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/516,341

(22) Filed: Nov. 1, 2021

(65) Prior Publication Data

US 2022/0057837 A1 Feb. 24, 2022

Related U.S. Application Data

(63) Continuation of application No. 16/453,860, filed on Jun. 26, 2019, now Pat. No. 11,163,337.

(30) Foreign Application Priority Data

Sep. 5, 2018 (KR) .................. 10-2018-0105953

(51) Int. Cl.
*G06F 1/16* (2006.01)

(52) U.S. Cl.
CPC .......... *G06F 1/1652* (2013.01); *G06F 1/1616* (2013.01); *G06F 1/1641* (2013.01)

(58) Field of Classification Search
None
See application file for complete search history.

(56) References Cited

U.S. PATENT DOCUMENTS

| | | | |
|---|---|---|---|
| 9,285,835 B2 | 3/2016 | Lee et al. | |
| 10,043,421 B2 | 8/2018 | Koo et al. | |
| 10,067,536 B1 | 9/2018 | Watamura | |
| 10,216,020 B2 | 2/2019 | Lim | |
| 10,230,062 B2 | 3/2019 | Kim et al. | |
| 10,290,239 B2 | 5/2019 | Liu | |
| 10,347,700 B2 | 7/2019 | Yang et al. | |
| 10,725,353 B2 | 7/2020 | Jeon et al. | |
| 2016/0209874 A1 | 7/2016 | Choi et al. | |
| 2017/0068275 A1 | 3/2017 | Lee et al. | |
| 2017/0278899 A1 | 9/2017 | Yang et al. | |
| 2018/0013080 A1 | 1/2018 | Kim et al. | |
| 2018/0062094 A1 | 3/2018 | Kwon et al. | |

(Continued)

FOREIGN PATENT DOCUMENTS

| | | |
|---|---|---|
| CN | 104021734 A | 9/2014 |
| CN | 104821138 A | 8/2015 |

(Continued)

*Primary Examiner* — Elmito Breval

(74) *Attorney, Agent, or Firm* — Lewis Roca Rothgerber Christie LLP

(57) ABSTRACT

A display device includes a flexible display module having thereon a first display area and a second display area adjacent to the first display area, the flexible display module being foldable with respect to a boundary between the first display area and the second display area, and a supporter including a first supporter overlapping the first display area and a second supporter overlapping the second display area and below the flexible display module, the first supporter including a first base supporter having a rigid property, and a first light absorption part on an outer surface of the first base supporter, and the second supporter including a second base supporter having a rigid property, and a second light absorption part on an outer surface of the second base supporter.

15 Claims, 17 Drawing Sheets

(56) References Cited

U.S. PATENT DOCUMENTS

2018/0068594 A1   3/2018   Dong
2018/0107250 A1   4/2018   Cho

FOREIGN PATENT DOCUMENTS

| | | |
|---|---|---|
| CN | 106898264 A | 6/2017 |
| CN | 107230693 A | 10/2017 |
| CN | 107591089 A | 1/2018 |
| CN | 107978625 A | 5/2018 |
| KR | 10-2014-0142418 A | 12/2014 |
| KR | 10-2015-0047356 A | 5/2015 |
| KR | 10-2016-0062824 A | 6/2016 |
| KR | 10-2016-0090471 A | 8/2016 |
| KR | 10-2017-0030023 A | 3/2017 |
| KR | 10-2018-0006530 A | 1/2018 |
| KR | 10-2018-0030326 A | 3/2018 |

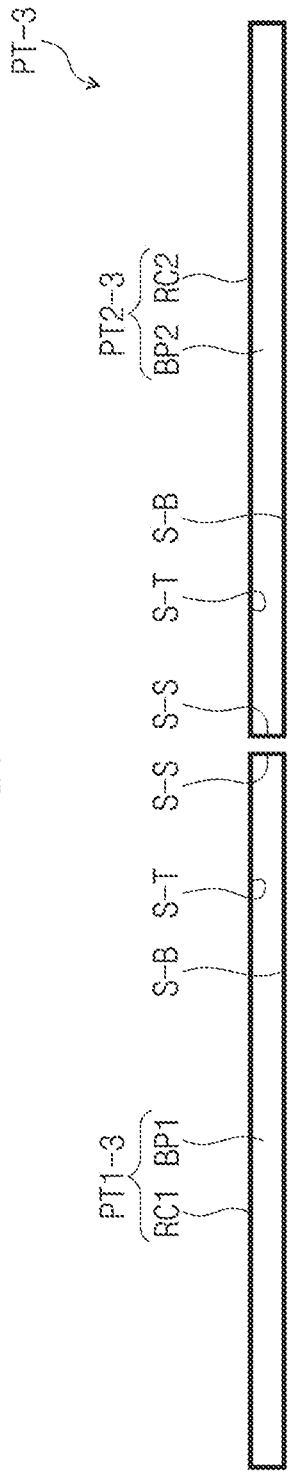
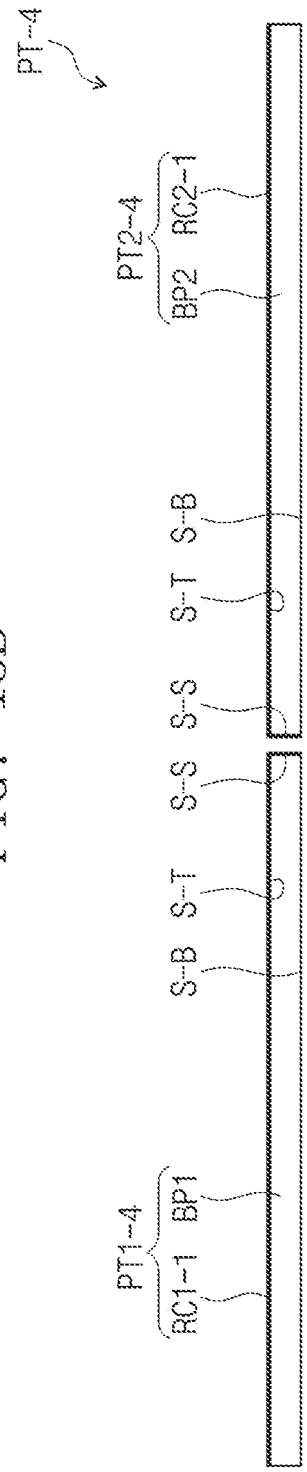
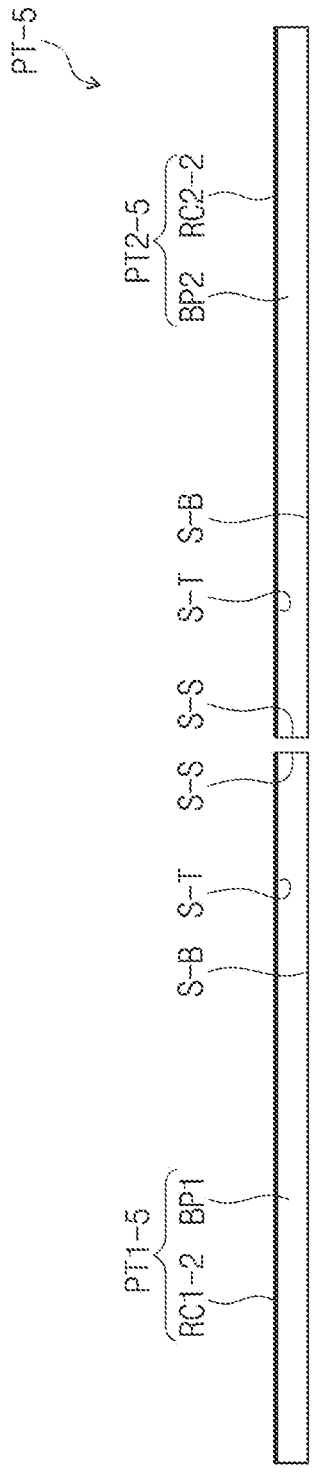
FIG. 15A
FIG. 15B
FIG. 15C

DISPLAY DEVICE

CROSS-REFERENCE TO RELATED APPLICATIONS

This application is a continuation of U.S. patent application Ser. No. 16/453,860, filed Jun. 26, 2019, which claims priority to and the benefit of Korean Patent Application No. 10-2018-0105953, filed Sep. 05, 2018, the entire content of both of which is incorporated herein by reference.

BACKGROUND

Aspects of the present disclosure herein relate to a foldable display device, and more particularly, to a display device that provides uniform display quality as a whole.

A display device is capable of displaying various images on a display screen to provide information to a user. In general, a display device displays information within an assigned screen. In recent years, a flexible display device including a foldable flexible display panel is being developed. The flexible display device may be foldable, rollable, or bendable, unlike a rigid display device. The flexible display device that is capable of being variously changed in shape may be portable regardless of a size of an existing screen to improve user's convenience.

When the foldable flexible display device is realized, a portion corresponding to a folding axis is different in structural characteristic from other portions which do not correspond to the folding axis, which can cause visibility defects at the portion corresponding to the folding axis.

SUMMARY

Aspects of the present disclosure are directed to a foldable display device of which a portion corresponding to a folding axis and other portions except for the portion corresponding to the folding axis have uniform display quality.

According to some embodiment of the inventive concept, there is provided a display device including: a flexible display module having thereon a first display area and a second display area adjacent to the first display area, the flexible display module being foldable with respect to a boundary between the first display area and the second display area; and a supporter including a first supporter overlapping the first display area and a second supporter overlapping the second display area and below the flexible display module, the first supporter including: a first base supporter having a rigid property; and a first light absorption part on an outer surface of the first base supporter, and the second supporter including: a second base supporter having a rigid property; and a second light asorption part on an outer surface of the second base supporter.

In some embodiments, each of the first light absorption part and the second light absorption part has a black color.

In some embodiments, each of the first base supporter and the second base supporter includes a metal.

In some embodiments, the first light absorption part is coated on the first base supporter, and the second light absorption part is coated on the second base supporter.

In some embodiments, the display device further includes: an impact absorption part below the flexible display module; and an adhesive below the impact absorption part, wherein each of the first supporter and the second supporter is coupled to the impact absorption part by the adhesive.

In some embodiments, the flexible display module includes: a flexible display panel including a plurality of pixels, each of the plurality of pixels includes an organic light emitting diode, and the plurality of pixels further including a driving circuit configured to provide a data signal to the plurality of pixels; and an input sensing circuit on the flexible display panel.

In some embodiments, the driving circuit is below the supporter.

In some embodiments, the first base supporter includes: a first body part; and a first protrusion extending from the first body part, the second base supporter including: a second body part; and a second protrusion extending from the second body part and overlapping the first protrusion.

In some embodiments, each of the first base supporter and the second base supporter has: a top surface; a bottom surface facing the top surface; and a side surface connecting the top surface to the bottom surface, and wherein each of the first light absorption part and the second light absorption part is on an entirety of the top surface corresponding thereto.

In some embodiments, each of the first light absorption part and the second light absorption part is further on at least a portion of the side surface corresponding thereto.

In some embodiments, each of the first light absorption part and the second light absorption part is on the side surface corresponding thereto and an entire bottom surface corresponding thereto.

In some embodiments, the display device further includes a set member including a first set member below the first supporter and a second set member below the second supporter, wherein the first set member includes: a first base set member having a rigid property; and a third light absorption part on an outer surface of the first base set member, and the second set member includes: a second base set member having a rigid property; and a fourth light absorption part on an outer surface of the second base set member.

In some embodiments, the flexible display module includes a plurality of pixels, each of the plurality of pixels including an organic light emitting diode, and the flexible display module further includes a driving circuit configured to provide a data signal to the plurality of pixels, and the driving circuit is between the set member and the supporter.

In some embodiments, each of the third light absorption part and the fourth light absorption part has a black color, and each of the first base set member and the second base set member includes a metal.

According to some embodiment of the inventive concept, there is provided a display device including: a flexible display module including a flexible display panel and an input sensing circuit on the flexible display panel, the flexible display module being foldable with respect to a bending axis; and a supporter including a first supporter below the flexible display module an a second supporter adjacent to the first supporter, the bending axis being defined by a boundary between the first supporter and the second supporter, the first supporter including: a first base supporter including a metal; and a first light absorption part on an outer surface of the first base supporter and having a black color, and the second supporter including: a second base supporter including a metal; and a second light absorption part on an outer surface of the second base supporter and having a black color.

In some embodiments, the display device further includes: an impact absorption part below the flexible display module; and an adhesive below the impact absorption part, wherein each of the first supporter and the second supporter is coupled to the impact absorption part by the adhesive.

In some embodiments, the flexible display panel includes a plurality of pixels, each of which include an organic light emitting diode, and a driving circuit configured to provide a data signal to the plurality of pixels, and the driving circuit is below the supporter.

In some embodiments, the flexible display panel includes a plurality of pixels, each of the plurality of pixels including an organic light emitting diode, and the flexible display panel further including a driving circuit configured to provide a data signal to the plurality of pixels, and the driving circuit is on the supporter.

In some embodiments, the first base supporter includes: a first body part; and a first protrusion extending from the first body part, and wherein the second base supporter includes: a second body part; and a second protrusion extending from the second body part and overlapping the first protrusion.

In some embodiments, each of the first base supporter and the second base supporter has: a top surface; a bottom surface facing the top surface; and a side surface connecting the top surface to the bottom surface, and each of the first light absorption part and the second light absorption part is on at least a portion of the top surface corresponding thereto.

In some embodiments, each of the first light absorption part and the second light absorption part is further on at least a portion of the side surface corresponding thereto.

In some embodiments, each of the first light absorption part and the second light absorption part is on the side surface corresponding thereto and on an entirety of the bottom surface corresponding thereto.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

In the drawings:

FIGS. 15A-15C are views illustrating an example of the supporter according to an embodiment of the inventive concept.

DETAILED DESCRIPTION

Hereinafter, exemplary embodiments of the inventive concept will be described with reference to the accompanying drawings.

In the figures, the ratio and dimensions of components are exaggerated for clarity of illustration.

Figure 1:
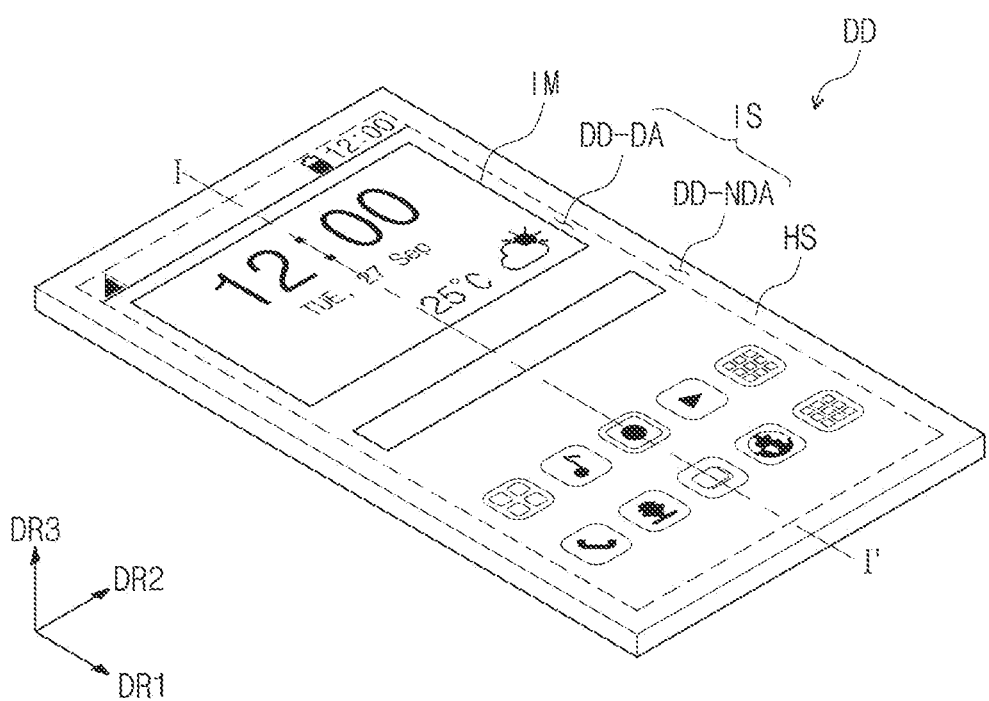
FIG. 1 is a perspective view of a display device according to an embodiment of the inventive concept.

FIG. 1 is a perspective view of a display apparatus DD according to an embodiment of the inventive concept. As illustrated in FIG. 1, a display surface IS on which an image IM is displayed is parallel to a surface that is defined by a first directional axis DR1 and a second directional axis DR2. A normal direction of the display surface IS, that is, a thickness direction of the display apparatus DD is indicated as a third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The display device DD according to an embodiment of the inventive concept may be a foldable display device. The display device DD according to an embodiment of the inventive concept may be used for large-sized electronic devices such as televisions and monitors and small and middle-sized electronic devices such as mobile phones, tablet PC, navigation units for vehicles, game consoles, and smart watches.

As illustrated in FIG. 1A, the display surface IS of the display device DD may include a plurality of areas. The display device DD includes a display area DD-DA on which the image IM is displayed and a non-display area DD-NDA that is adjacent to the display area DD-DA. The non-display area DD-NDA may be an area on which an image is not (e.g., cannot be) displayed. FIG. 1 illustrates icons and a clock window of an application as an example of the image IM. The display area DD-DA may have a rectangular (or substantially rectangular) $_{shape}$. The non-display area DD-NDA may surround the display area DD-DA. However, embodiments of the inventive concept are not limited thereto.

The display device DD may include a housing HS. The housing HS may be disposed outside the display device DD to accommodate components therein.

FIGS. 2A to 2E are views illustrating a state in which the display device DD of FIG. 1 is folded.

Figure 2A:
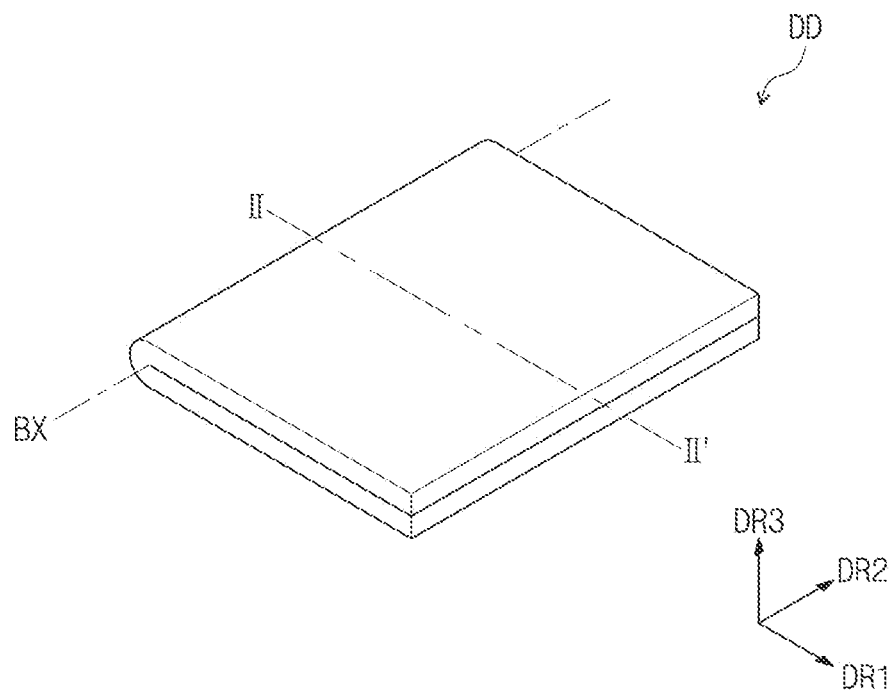
FIGS. 2A-2E are views illustrating a state in which the display device of FIG. 1 is folded.
Figure 2B:
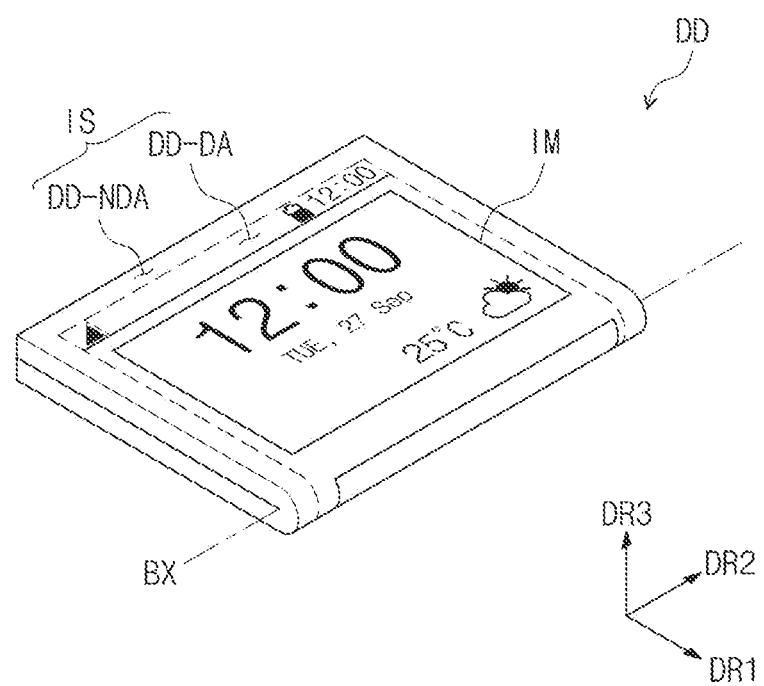
Figure 2C:
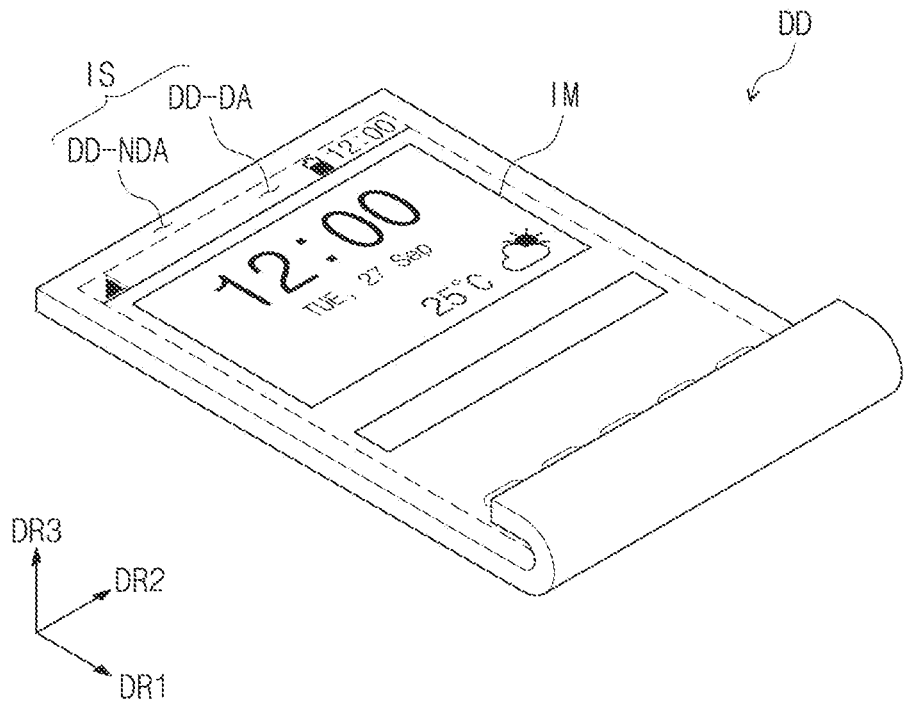
Figure 2D:
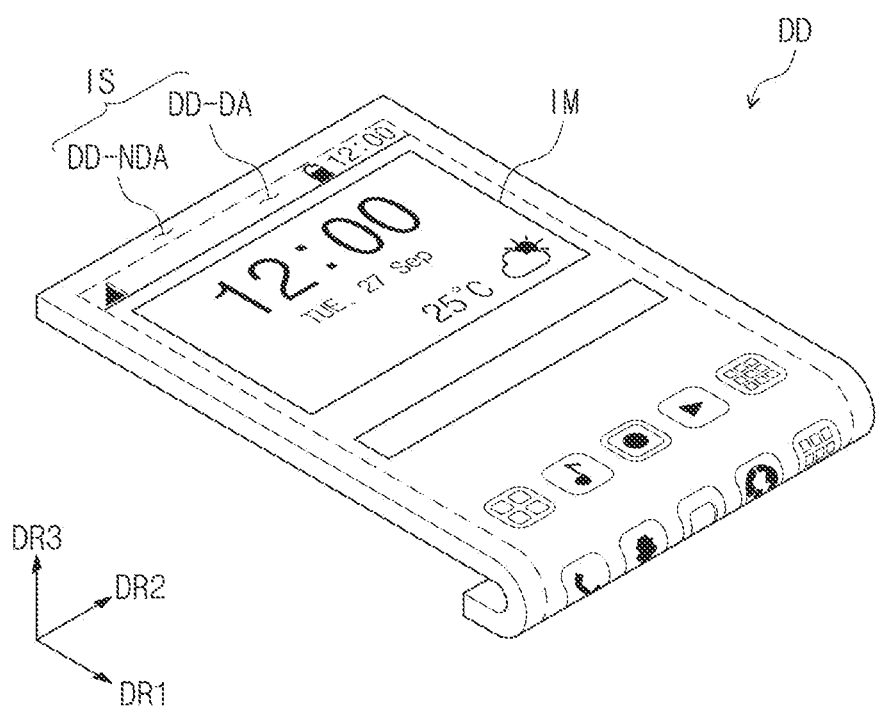
Figure 2E:
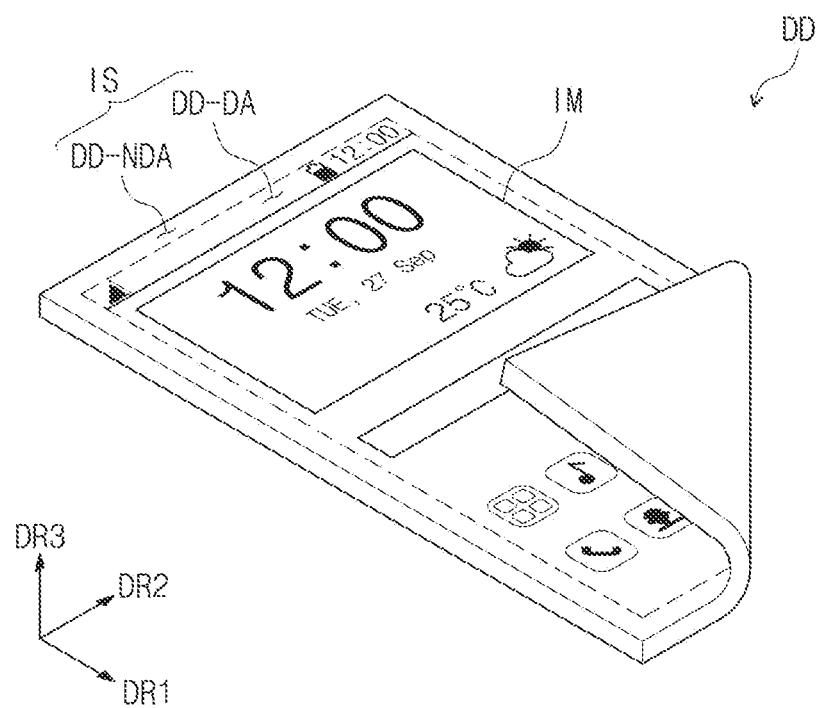

Referring to FIG. 2A, the display device DD according to an embodiment of the inventive concept may be in-folded with respect to a bending axis BX. Referring to FIG. 2B, the display device DD according to an embodiment of the inventive concept may be out-folded with respect to the bending axis BX. Referring to FIG. 2C, the display device DD according to an embodiment of the inventive concept may be folded inward from an end thereof. Referring to FIG. 2D, the display device DD according to an embodiment of the inventive concept may be folded outward from the end thereof. Referring to FIG. 2E, the display device DD according to an embodiment of the inventive concept may be folded in a diagonal direction. FIGS. 2A to 2E are views illustrating an example of the folding method of the display device DD, but is not limited thereto.

Figure 3:
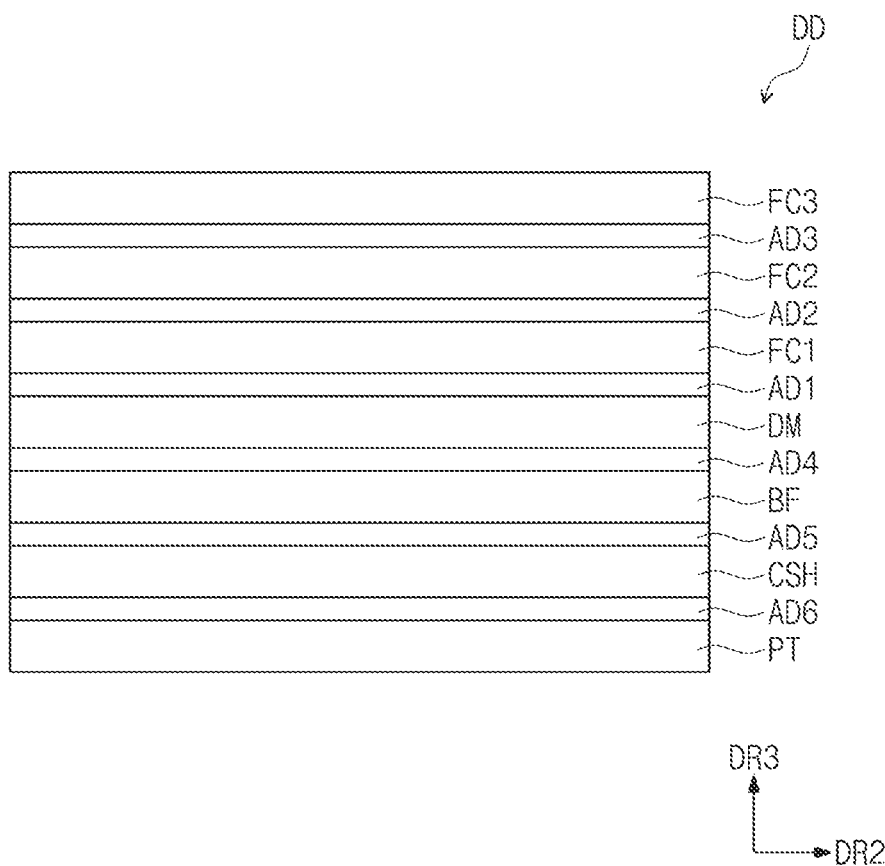
FIG. 3 is a cross-sectional view of the display device according to an embodiment of the inventive concept.
Figure 4A:
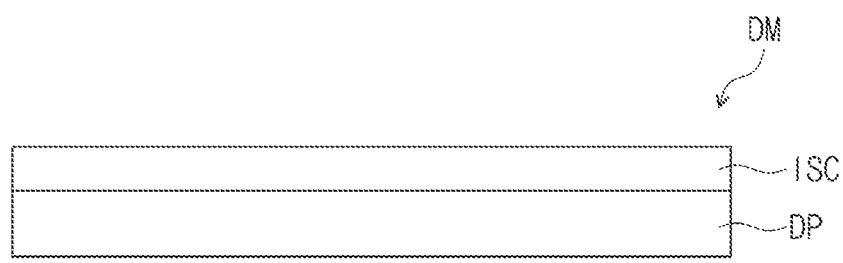
FIGS. 4A-4B are cross-sectional views of a display module of FIG. 3.
Figure 4B:
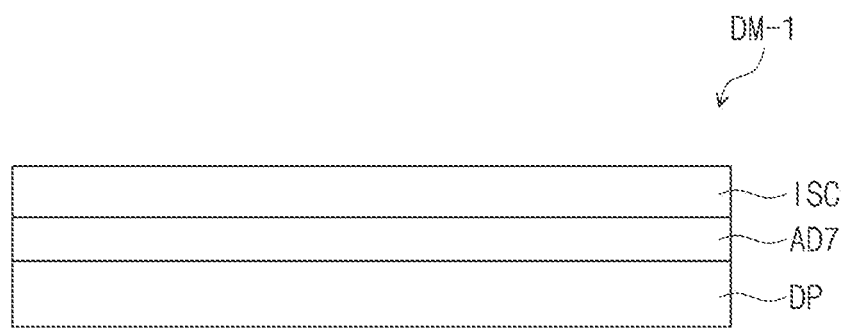

FIG. 3 is a cross-sectional view of the display device DD according to an embodiment of the inventive concept. FIGS. 4A and 4B are cross-sectional views of display modules DM and DM-1 of FIG. 3. FIG. 3 illustrates a cross-section defined by the second directional axis DR2 and the third directional axis DR3.

The display device DD may include a display module DM, a plurality of functional layers FC1 to FC3, a base film BF, an impact absorption part CSH, a supporter PT, and a plurality of adhesives AD1 to AD6.

According to an embodiment of the inventive concept, each of the adhesives AD1 to AD6 may be a pressure sensitive adhesive (PSA).

The functional layers FC1 to FC3 may be disposed above the display module DM.

The first functional layer FC1 may adhere to the display module DM by a first adhesive AD1. The second functional layer FC2 may adhere to the first functional layer FC1 by a second adhesive AD2. The third functional layer FC3 may adhere to the second functional layer FC2 by a third adhesive AD3.

Each of the functional layers FC1 to FC3 may include a polymer material. Each of the functional layers FC1 to FC3 may have a film shape. Each of the functional layers FC1 to FC3 may have a modulus of about 2 Gpa to about 100 Gpa.

Each of the functional layers FC1 to FC3 may have a thickness of about 35 um to about 60 μm. When each of the functional layers FC1 to FC3 has a thickness of about 35 μm or less, performance of the originally intended function may be deteriorated. When each of the functional layers FC1 to FC3 has a thickness of 60 μm or more, flexibility of the display device DD may be reduced. In an embodiment of the inventive concept, a first functional layer FC1 may be a polarizing functional layer for polarizing incident light. The second functional layer FC2 may be an impact absorption functional layer that absorbs an impact applied from the outside (e.g., from outside of the display device DD). The third functional layer FC3 may be a window functional layer constituting an outer surface of the display device DD. In another embodiment of the inventive concept, a portion of the first to third functional layers FC1 to FC3 may be omitted.

The base film BF, the impact absorption part CSH, and the supporter PT are disposed below the display module DM.

The base film BF may adhere to the display module DM by a fourth adhesive AD4. The base film BF may include a polymer material.

The impact absorption part CSH may adhere to the base film BF by a fifth adhesive AD5. The impact absorption part CSH may include a polymer material. The impact absorption part CSH may be a layer for absorbing an impact applied from the outside.

The supporter PT may adhere to the impact absorption part CSH by a sixth adhesive AD6. The supporter PT may support the display module DM. The supporter PT may include a hinge that allows the display module DM to be folded or bendable. The supporter PT may have a rigid property.

Referring to FIG. 4A, the display module DM may include the display panel DM and an input sensing circuit ISC. The input sensing circuit ISC may sense touch and/or a pressure applied from the outside.

The input sensing circuit ISC may be directly disposed on an encapsulation layer of the display panel DP. Here, the direct disposition may mean that the input sensing circuit ISC is disposed on the display panel DP without using a separate adhesive.

Referring to FIG. 4B, a display module DM-1 may include a display panel DP, an input sensing circuit ISC, and a seventh adhesive AD7. The display panel DP and the input sensing circuit ISC may adhere to each other via the seventh adhesive AD7.

Figure 5:
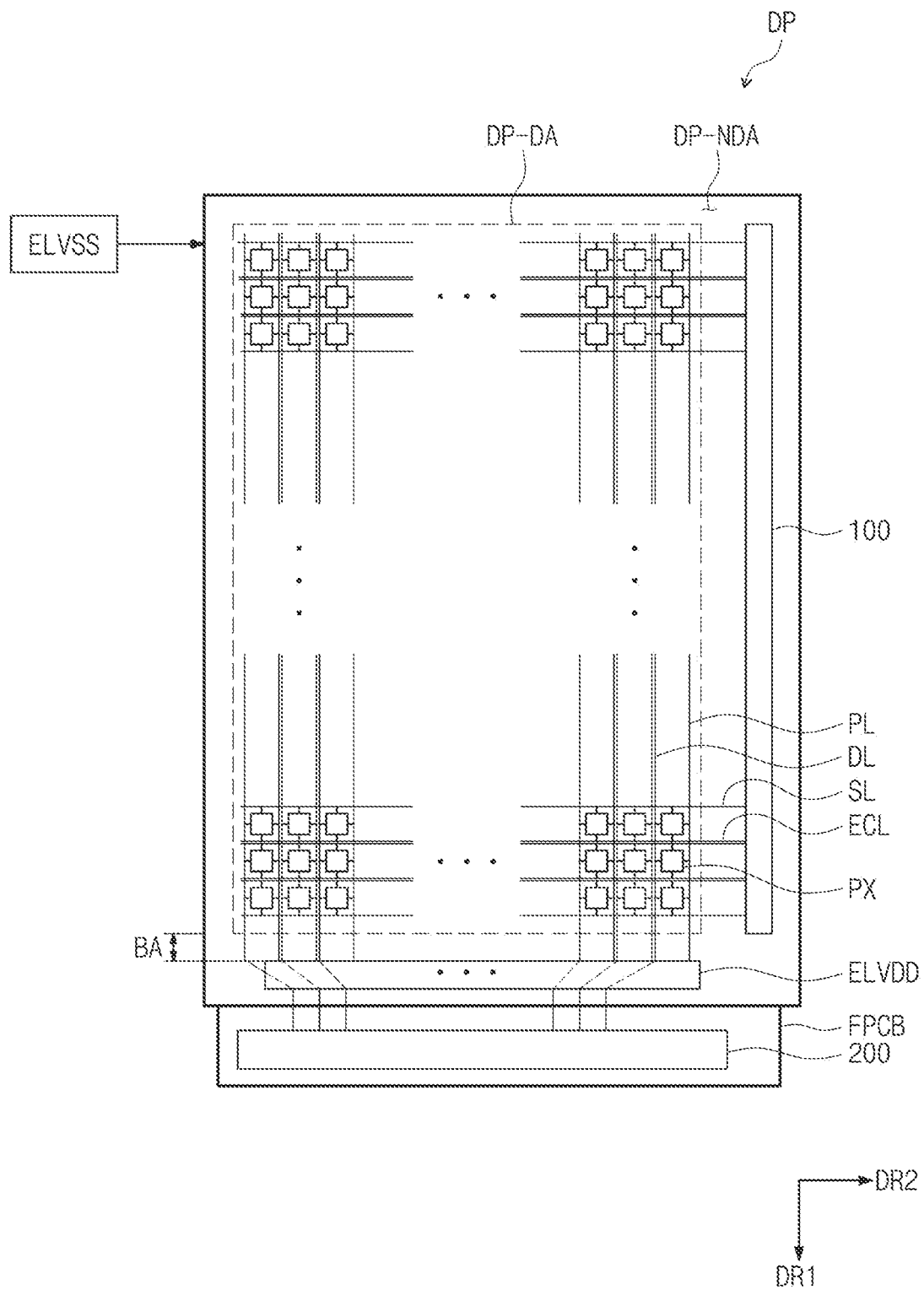
FIG. 5 is a block diagram of a display panel according to an embodiment of the inventive concept.

FIG. 5 is a block diaram of the display panel DP according to an embodiment of the inventive concept.

The display panel DP includes a display area DP-DA and a non-display area DP-NDA on a plane. In this embodiment, the non-display area DP-NDA may be defined along an edge of the display area DP-DA. The display area DP-DA and the non-display area DP-NDA of the display panel DP may correspond to the display area DD-DA and the non-display area DD-NDA of the display apparatus of FIG. 1, respectively.

The display panel DP may include a scan driver 100, a data driver 200, a plurality of scan lines SL, a plurality of emission control lines ECL, a plurality of data lines DL, a plurality of power lines PL, and a plurality of pixels PX (hereinafter, referred to as pixels). The pixels PX are disposed on the display area DP-DA. Each of the pixels PX includes an organic light emitting diode OLED (see FIG. 6) and a pixel circuit CC (see FIG. 6) connected to the organic light emitting diode OLED.

The scan driver 100 may include a scan driving unit and an emission control driving unit.

The scan driving unit generates scan signals to sequentially output the generated scan signals to the scan lines SL. The emission control driving unit generates emission control signals to output the generated emission control signals to the emission control lines SL.

In another embodiment of the inventive concept, the scan driving unit and the emission control driving unit may be provided as one circuit in the scan driver 100 without being divided from each other.

The scan driver 100 may include a plurality of thin film transistors that are manufactured through the same process as the driving circuit of the pixel PX, for example, a low temperature polycrystalline silicon (LTPS) process, a low temperature polycrystalline oxide (LTPO) process, or the like.

The data driver 200 outputs data signals to the data lines DL. The data signals are analog voltages corresponding to gray level values of the image data.

In an embodiment of the inventive concept, the data driver 200 may be mounted on a printed circuit board FPCB, and the printed circuit board FPCB may be connected to pads disposed on one end of the data lines DL. However, embodiments of the inventive concept are not limited thereto. For example, the data drive 200 may be directly mounted on the display panel DP.

The scan lines SL may extend in the second direction DR2 and be arranged in the first direction DR1 crossing the second direction DR2. In an embodiment of the inventive concept, the second direction DR and the first direction DR1 may be perpendicular to each other, but is not limited thereto.

The emission control lines ECL may extend in the first direction DR1 and may be arranged in the second direction DR2. That is, each of the emission control lines ECL may be disposed in parallel to the corresponding scan line of the scan lines SL.

The data lines DL extend in the first direction DR1 and are arranged in the second direction DR2 crossing the first direction DR1. The data lines DL may provide data signals to the corresponding pixels PX.

The power lines PL extend in the first direction DR1 and are arranged in the second direction DR2. The power lines PL may provide first power ELVDD to the corresponding pixels PX.

Each of the plurality of pixels PX is connected to the corresponding scan line of the scan lines SL, the corresponding emission control line of the emission control lines ECL, the corresponding data line of the data lines DL, and the corresponding power line of the power lines PL.

The non-display area DP-NDA of the display panel DP may include a bending area BA. When the display panel DP is bent with respect to the bending area BA, the non-display area DP-NDA may decrease in area on a plane defined by the first direction DR1 and the second direction DR2 to provide the display device DD having a thin bezel. That is, in FIG. 1, the display device DD having a small area of the non-display area DD-NDA may be provided.

Figure 6:
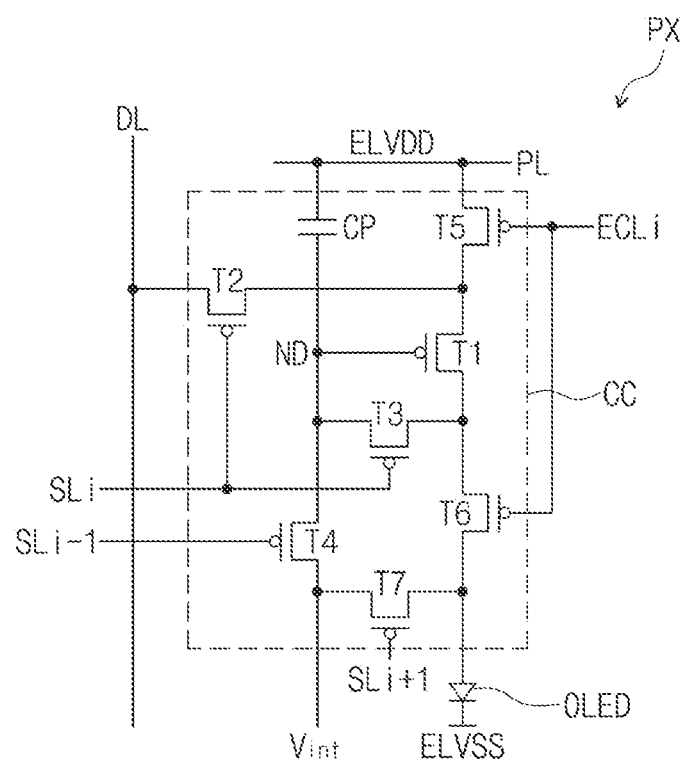
FIG. 6 is an equivalent circuit diagram of a pixel according to an embodiment of the inventive concept.
Figure 7:
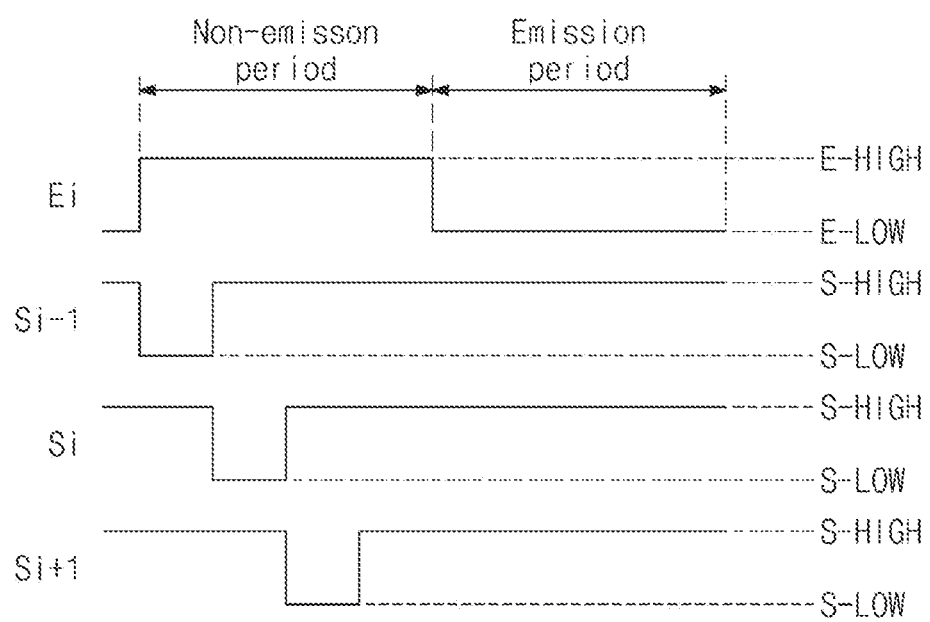
FIG. 7 is a view illustrating an example of a emission control signal and scan signals, which are applied to the pixel of FIG. 6.

FIG. 6 is an equivalent circuit diagram of the pixel PX according to an embodiment of the inventive concept. FIG. 7 is a view illustrating an example of an emission control signal Ei and scan signals Si−1, Si, and Si+1, which are applied to the pixel PX of FIG. 6. FIG. 6 illustrates an example of the pixel PX connected to an i−th scan line SLi and an i−th emission control line ECLi.

The pixel PX may include an organic light emitting diode OLED and a pixel circuit CC. The pixel circuit CC may include a plurality of transistors T1 to T7 and a capacitor CP. The pixel circuit CC controls an amount of current flowing through the organic light emitting diode OLED in response to the data signal.

The organic light emitting diode OLED may emit light at a set or predetermined luminance corresponding to an amount of current supplied from the pixel circuit CC. For this, a first power source ELVDD may be set to a level greater than that of a second power source ELVSS.

Each of the transistors T1 to T7 may include an input electrode (or a source electrode), an output electrode (or a drain electrode), and a control electrode (or a gate electrode). In this specification, for convenience, either the input electrode or the output electrode may be referred to as a first electrode and the other may be referred to as a second electrode.

The first electrode of the first transistor T1 is connected to the first power source ELVDD via the fifth transistor T5, and the second electrode is connected to an anode electrode of the organic light emitting diode OLED via the sixth transistor T6. The first transistor T1 may be called a driving transistor in this specification.

The first transistor T1 controls an amount of current flowing through the organic light emitting diode OLED corresponding to a voltage applied to the control electrode.

The second transistor T2 is connected between the data line DL and the first electrode of the first transistor T1. Also, the control electrode of the second transistor T2 is connected to an i-th scan line SLi. When an i-th scan signal Si is applied to the i- th scan line SLi, the second transistor T2 may be turned on to electrically connect the data line DL to the first electrode of the first transistor T1.

The third transistor T3 is connected between the second electrode of the first transistor T1 and the control electrode. The control electrode of the third transistor T3 is connected to the i-th scan line SLi. When the i-th scan signal Si is applied to the i-th scan line SLi, the third transistor T3 may be turned on to electrically connect the second electrode of the first transistor T1 to the control electrode. Thus, when the third transistor T3 is turned on, the first transistor T1 is connected in the form of a diode.

The fourth transistor T4 is connected between a node ND and an initialization power generation unit. Also, the control electrode of the fourth transistor T4 is connected to an (i−1)-th scan line SLi−1. When an (i−1)-th scan signal Si−1 is provided to the (i−1)-th scan line SLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to an i-th emission control line ECLi.

The sixth transistor T6 is connected between the second electrode of the first transistor T1 and the anode electrode of the organic light emitting diode OLED. Also, the control electrode of the sixth transistor T6 is connected to the i−th emission control line ECLi.

The seventh transistor T7 is connected between the initialization power generation unit and the anode electrode of the organic light emitting diode OLED. Also, the control electrode of the seventh transistor T7 is connected to an (i+1)-th scan line SLi+1. When the (i+1)-th scan signal Si+1 is provided to the (i+1)-th scan line SLi+1, the seventh transistor T7 is turned on to provide the initialization voltage Vint to the anode electrode of the organic light emitting diode OLED.

The seventh transistor T7 may improve black display capability of the pixel PX. Particularly, when the seventh transistor T7 is turned on, a parasitic capacitor of the organic light emitting diode OLED is discharged. Thus, when black luminance is implemented, the organic light emitting diode OLED does not emit light due to leakage current from the first transistor T1, and thus, the black display capability may be improved.

Additionally, although the control electrode of the seventh transistor T7 is connected to the (i+1)-th scan line SLi+1 in FIG. 6, embodiments of the inventive concept are not limited thereto. In another embodiment of the inventive concept, the control electrode of the seventh transistor T7 may be connected to the i-th scan line SLi or the (i−1)-th scan line SLi−1.

Although a PMOS is illustrated in FIG. 6, embodiments of the inventive concept are not limited thereto. In another embodiment of the inventive concept, the pixel PX may include NMOS type transistors. In another embodiment of the inventive concept, the pixel PX may include a combination of NMOS and the PMOS type transistors.

The capacitor CP is disposed between the power line PL and the node ND. The capacitor CP stores a voltage corresponding to the data signal. When the fifth transistor T5 and the sixth transistor T6 are turned on according to the voltage stored in the capacitor CP, an amount of current flowing through the first transistor T1 may be determined.

In the inventive concept, a structure of the pixel PX is not limited to the structure of FIG. 6. A pixel according to another embodiment of the inventive concept may have various suitable shapes to allow the organic light emitting diode OLED to emit light.

Referring to FIG. 7, an emission control signal Ei may have a high level E-HIGH and a low level E-LOW. Each of the scan signals SLi−1, SLi, and SLi+1 may have a high level S-HIGH and a low level S-LOW.

When the emission control signal Ei has the high level E-HIGH, the fifth transistor T5 and the sixth transistor T6 may be turned off. When the fifth transistor T5 is turned off, the power line PL and the first electrode of the first transistor T1 are electrically interrupted (e.g., electrically isolated or disconnected). When the sixth transistor T6 is turned off, the second electrode of the first transistor T1 and the anode electrode of the organic light emitting diode OLED are electrically interrupted. Thus, the organic light emitting diode OLED does not emit light during a period for which the emission control signal Ei having the high level E-HIGH is provided to the i−th emission control line ECLi.

Thereafter, when the (i−1)-th scan signal Si provided to the (i−1)-th scan line SLi−1 has the low level S-LOW, the fourth transistor T4 is turned off. When the fourth transistor T4 is turned on, the initialization voltage Vint is provided to the node ND.

When the i−th scan signal Si provided to the i−th scan line SLi has the low level S-LOW, the second transistor T2 and the third transistor T3 are turned on.

When the second transistor T2 is turned on, the data signal is provided to the first electrode of the first transistor T1. Here, since the node ND is initialized to the initialization voltage Vint, the first transistor T1 is turned on. When the first transistor T1 is turned on, a voltage corresponding to the data signal is provided to the node ND. Here, the capacitor CP stores a voltage corresponding to the data signal.

When the (i+1)-th scan signal Si+1 provided to the (i+1)-th scan line SLi+1 has the low level S-LOW, the seventh transistor T7 is turned on.

When the seventh transistor T7 is turned on, the initialization voltage Vint is provided to the anode electrode of the organic light emitting diode OLED to discharge the parasitic capacitance of the organic light emitting diode OLED.

When the emission control signal Ei provided to the emission control line ECLi has the low level E-LOW, the fifth transistor T5 and the sixth transistor T6 are turned on. When the fifth transistor T5 is turned on, the first power source ELVDD is provided to the first electrode of the first transistor T1. When the sixth transistor T6 is turned on, the second electrode of the first transistor T1 and the anode electrode of the organic light emitting diode OLED are electrically connected to each other. Thus, the organic light emitting diode OLED may generate light having a set or predetermined luminance corresponding to an amount of provided current.

Figure 8:
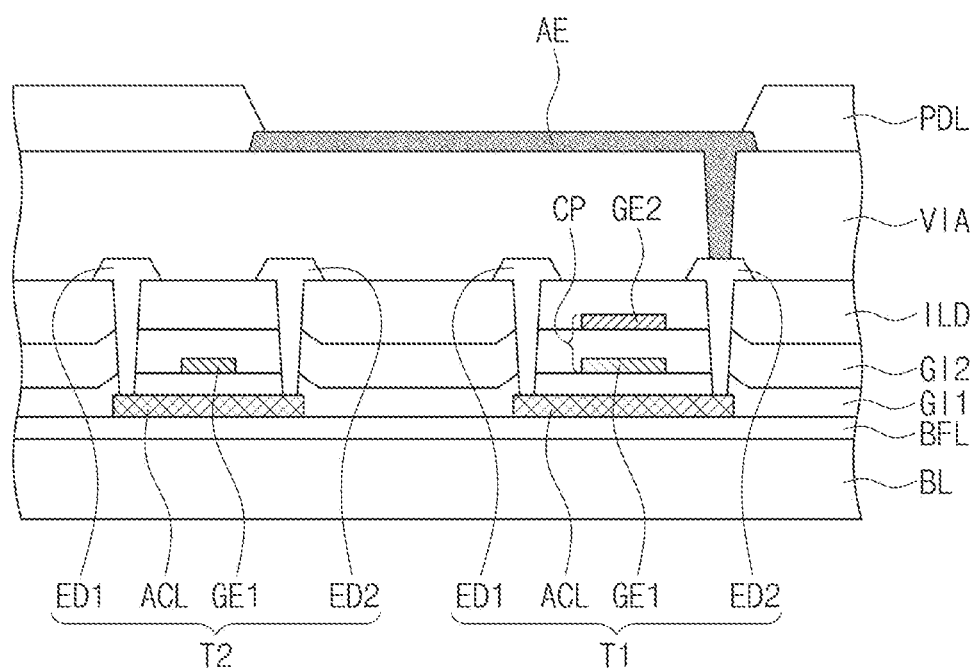
FIG. 8 is a cross-sectional view illustrating a portion of the pixel according to an embodiment of the inventive concept.

FIG. 8 is a cross-sectional view illustrating a portion of the pixel PX (see FIG. 6) according to an embodiment of the inventive concept. Although the first transistor T1 and the second transistor T2 are illustrated as an example in FIG. 8, a structure of each of the first and second transistors T1 and T2 is not limited thereto. Although a second electrode ED2 of the first transistor T1 directly contacts the anode electrode AE of the pixel PX (e.g., of the organic light emitting diode OLED) in FIG. 8, embodiments of the present invention are not limited thereto. For example, as illustrated in FIG. 6, the first transistor T1 may be connected to the anode electrode AE of the pixel PX (e.g., of the organic light emitting diode OLED) via the sixth transistor T6. However, as shown in FIG. 8, the second electrode ED2 of the first transistor T1 may directly contact the anode electrode AE of the pixel PX (e.g., of the organic light emitting diode OLED).

The display panel DP (see FIG. 5) may include a base layer BL, a buffer layer BFL, gas insulation layers GI1 and GI2, an interlayer dielectric ILD, a circuit insulation layer VIA, and a pixel defining layer PDL.

The buffer layer BFL is disposed on one surface of the base layer BL.

The buffer layer BFL prevents or substantially prevents impurities existing on the base layer BL from being introduced into the pixel PX during the manufacturing process. Particularly, the buffer layer BFL prevents or substantially prevents the impurities from being diffused into active parts ACL of the transistors T1 and T2 constituting the pixel PX.

The impurities may be introduced from the outside or generated while the base substrate BL is pyrolyzed. The impurities may include a gas or sodium discharged from the base substrate BL. Also, the buffer layer BFL may block moisture introduced from the outside into the pixel PX.

The active parts ACL constituting each of the transistors T1 and T2 are disposed on the buffer layer BFL. Each of the active parts ACL may include polysilicon, amorphous silicon, and/or the like. In addition, each of the active parts ACL may be a metal oxide semiconductor or the like.

Each of the active parts ACL may include a channel region serving as a passage through which electrons or holes move and first and second ion-doped regions disposed with the channel region therebetween.

A first gate insulation layer GI1 covering the active parts ACL is disposed on the buffer layer BFL. The first gate insulation layer GI1 includes an organic layer and/or an inorganic layer. The first gate insulation layer GI1 may include a plurality of inorganic thin films. The plurality of inorganic thin films may include a silicon nitride layer, a silicon oxide layer, and/or the lilke.

Control electrodes GE1 constituting each of the transistors T1 and T2 are disposed on the first gate insulation layer GI1. The control electrode GE1 of the first transistor T1 may be one of two electrodes constituting the capacitor CP. At least a portion of the scan lines SL (see FIG. 5) and the emission control lines ECL (see FIG. 5) may be disposed on the first gate insulation layer GI1.

A second gate insulation layer GI2 covering the control electrodes GE1 is disposed on the first gate insulation layer GI1. The second gate insulation layer GI2 includes an organic layer and/or an inorganic layer. The second gate insulation layer GI2 may include a plurality of inorganic thin films. The plurality of inorganic thin films may include a silicon nitride layer, a silicon oxide layer, and/or the like.

The other electrode GE2 of the two electrodes constituting the capacitor CP (see FIG. 6) may be disposed on the second gate insulation layer GI2. That is, the electrode GE1 disposed on the first gate insulation layer GI1 and the electrode GE2 disposed on the second gate insulation layer GI2 may overlap each other to constitute the capacitor CP of FIG. 6. However, the structure in which the electrodes constituting the capacitor CP are disposed is not limited thereto.

The interlayer dielectric ILD covering the electrodes GE2 is disposed on the second gate insulation layer GI2. The interlayer dielectric ILD includes an organic layer and/or an inorganic layer. The interlayer dielectric ILD may include a plurality of inorganic thin films. The plurality of inorganic thin films may include a silicon nitride layer, a silicon oxide layer, and/or the like.

At least a portion of the data line DL (see FIG. 5) and the power line PL (see FIG. 5) may be disposed on the interlayer dielectric ILD. First electrode ED1 and second electrodes ED2 of each of the transistors T1 and T2 may be disposed on the interlayer dielectric ILD.

The first electrodes ED1 and the second electrodes ED2 may be connected to the corresponding active parts ACL through through-holes (or openings) passing through the gate insulation layers GI1 and GI2 and the interlayer dielectric ILD, respectively.

A circuit insulation layer VIA covering the first electrodes ED1 and the second electrodes ED2 is disposed on the interlayer dielectric ILD. The circuit insulation layer VIA includes an organic layer and/or an inorganic layer. The circuit insulation layer VIA may provide a flat surface.

The pixel define layer PDL and the organic light emitting diode OLED are disposed on the circuit insulation layer VIA. In FIG. 8, for convenience, only the anode electrode AE of the organic light emitting diode OLED is illustrated. The organic light emitting diode OLED may further include a hole transport region, a light emitting layer, an electron transport region, and a cathode in addition to the anode electrode AE. The display panel DP may include a thin film encapsulation layer sealing the organic light emitting diode OLED.

Figure 9A:
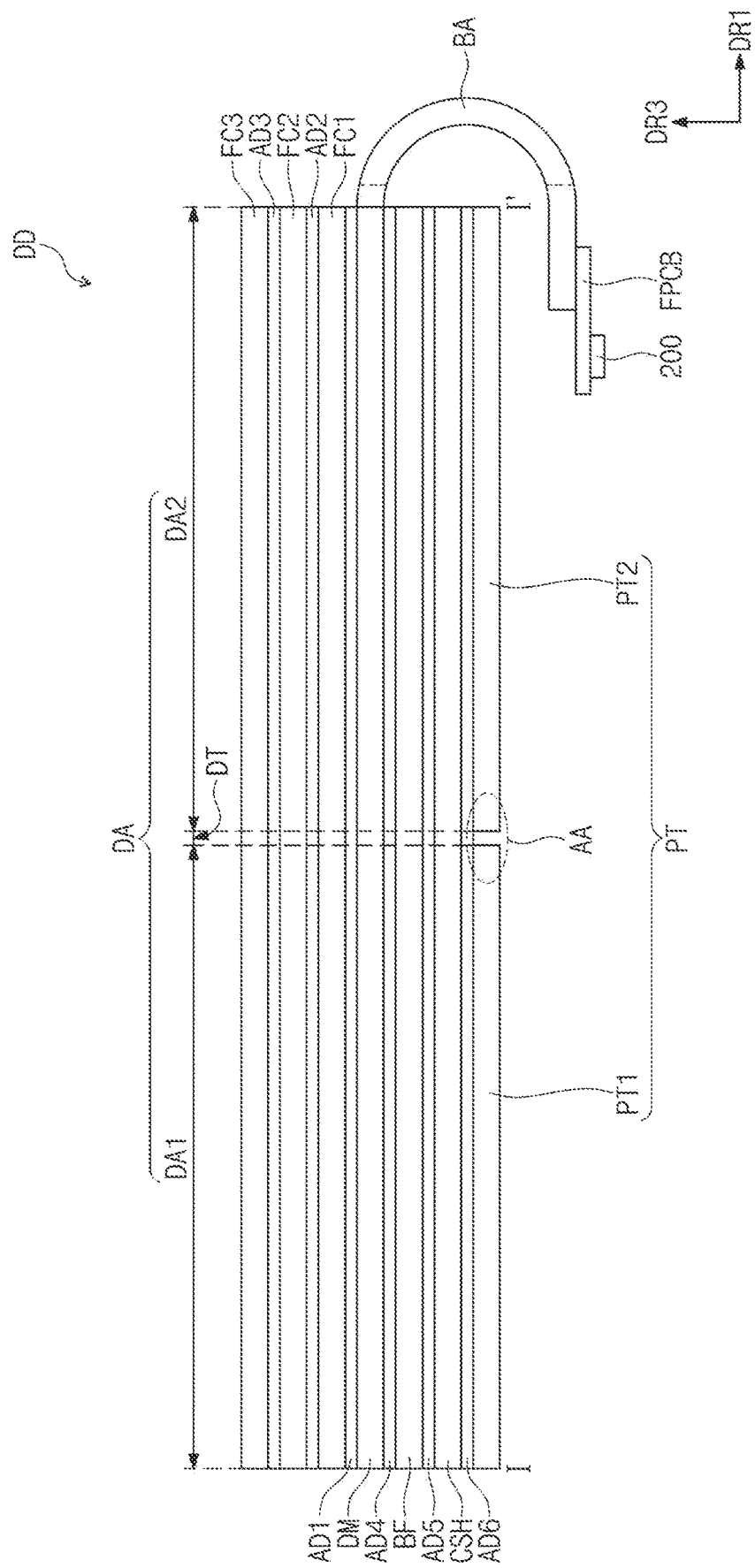
FIG. 9A is a partial cross-sectional view taken along the line I-I' of FIG. 1.
Figure 9B:
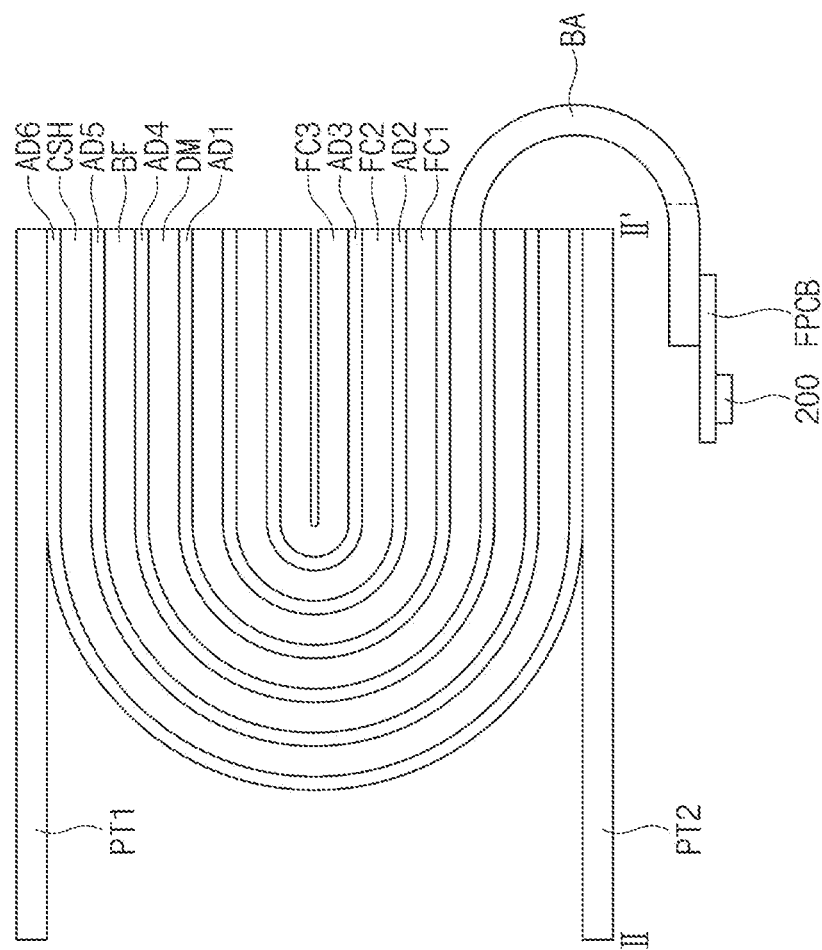
FIG. 9B is a partial cross-sectional view taken along the line II-II' of FIG. 2A.

FIG. 9A is a partial cross-sectional view taken along the line I-I' of FIG. 1. FIG. 9B is a partial cross-sectional view taken along the line II-II' of FIG. 2A. That is, FIG. 9B illustrates an example of a state in which the display device DD of FIG. 9A is folded.

The display area DA may include a first display area DA1 and a second display area DA2 with respect to the bending axis BX (see FIG. 2A).

The supporter PT may include a first supporter PT1 and a second supporter PT2. The first supporter PT1 overlaps the first display area DA1 in the third direction DR3, and the second supporter PT2 overlaps the second display area DA2 in the third direction DR3.

The first supporter PT1 may be spaced a set or predetermined distance (hereinafter, referred to as gap or a spaced distance DT) from the second supporter PT2.

In an embodiment of the inventive concept, the bending axis BX (see FIG. 2A) may be defined by a boundary between the first supporter PT1 and the second supporter PT2. In an embodiment of the inventive concept, the bending axis BX (see FIG. 2A) may be defined as an axis overlapping the boundary between the first supporter PT1 and the second supporter PT2 in the third direction DR3.

Referring to FIG. 9B, a portion of the first supporter PT1 adjacent to the bending axis BX (see FIG. 2A) and a portion of the second supporter PT2 adjacent to the bending axis BX (see FIG. 2A) may not adhere to the sixth adhesive AD6. Thus, when the display device DD is folded with respect to the bending axis BX (see FIG. 2A), limitations occurring because each of the first supporter PT1 and the second supporter PT2 has the rigid property may be solved.

Figure 10A:
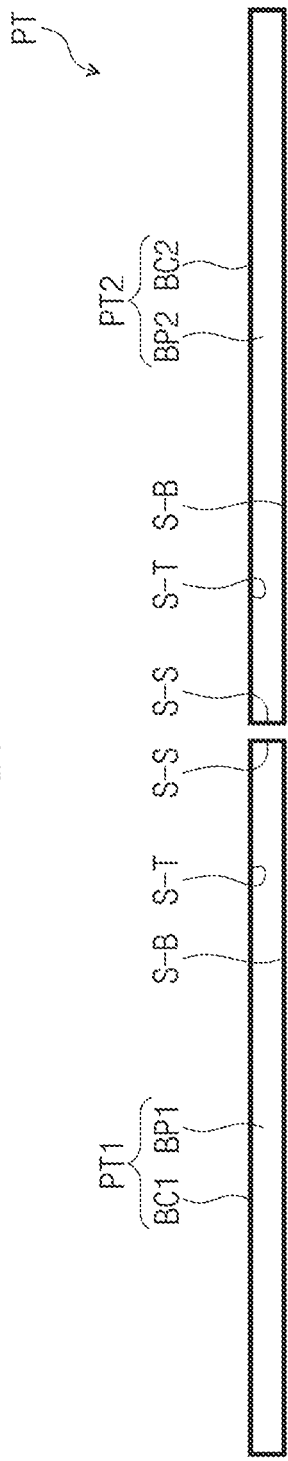
FIGS. 10A-10C are views illustrating an example of a supporter according to an embodiment of the inventive concept.
Figure 10B:
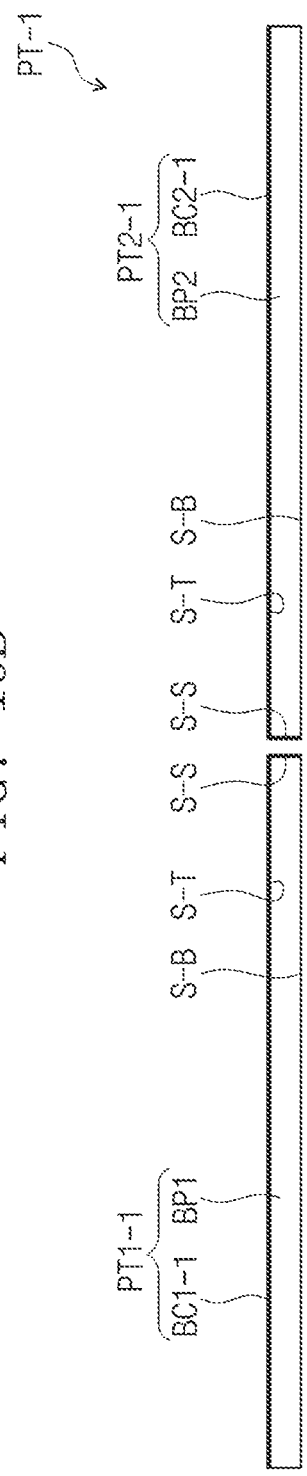
Figure 10C:
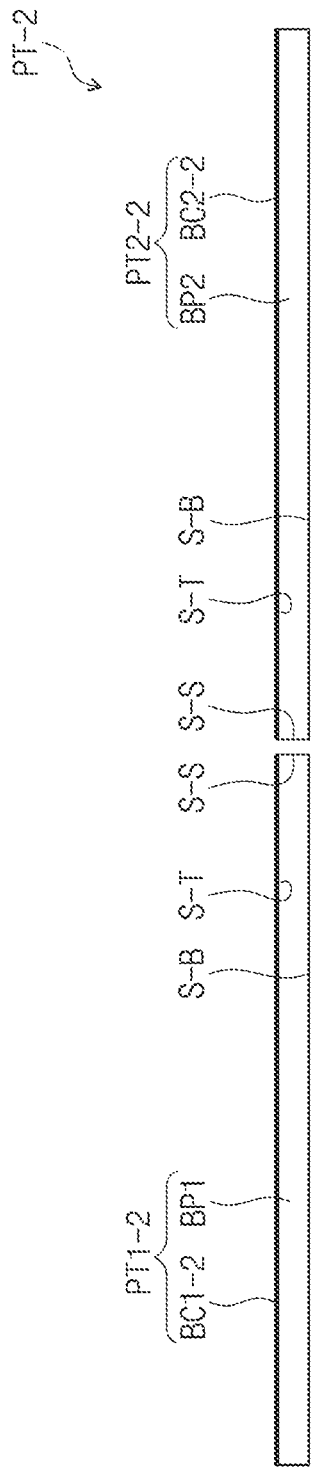

FIGS. 10A, 10B, and 10C are views illustrating examples of supporters PT, PT-1, and PT-2 according to an embodiment of the inventive concept, respectively.

Referring to FIG. 10A, the first supporter PT1 may include a first base supporter BP1 and a first light absorption part BC1 disposed on an outer surface of the first base supporter BP1. The second supporter PT2 may include a second base supporter BP2 and a second light absorption part BC2 disposed on an outer surface of the second base supporter BP2.

Each of the first base supporter BP1 and the second base supporter BP2 may include a metal. The metal may include magnesium (Mg). Each of the first base supporter BP1 and the second base supporter BP2 may have a rigid property.

Each of the first base supporter BP1 and the second base supporter BP2 may include a top surface S-T, a bottom surface S-B facing the top surface S-T, and a side surface S-S connecting the top surface S-T to the bottom surface S-B.

The first light absorption part BC1 and the second light absorption part BC2 may be configured to prevent or substantially prevent light from being transmitted or reflected and may have a black color.

In an embodiment of the inventive concept, the first light absorption part BC1 and the second light absorption part BC2 may be applied to (coated on) the first base supporter BP1 and the second base supporter BP2, respectively.

The first light absorption part BC1 may be disposed on all of the top surface S-T, the bottom surface S-B, and the side surface S-S of the first base supporter BP1. The second light absorption part BC2 may be disposed on all of the top surface S-T, the bottom surface S-B, and the side surface S-S of the second base supporter BP2.

Referring to FIG. 10B, the first supporter PT1-1 may include a first base supporter BP1 and a first light absorption part BC1-1 disposed on an outer surface of the first base supporter BP1. The second supporter PT2-1 may include a second base supporter BP2 and a second light absorption part BC2-1 disposed on an outer surface of the second base supporter BP2.

The first light absorption part BC1-1 may be disposed on at least a portion of the top surface S-T and the side surface S-S of the first base supporter BP1 and may not be disposed on the bottom surface S-B. The second light absorption part BC2-1 may be disposed on at least a portion of the top surface S-T and the side surface S-S of the second base supporter BP2 and may not be disposed on the bottom surface S-B.

In addition, other descriptions with respect to FIG. 10B are substantially the same as those described in reference to FIG. 10A and thus may be omitted.

Referring to FIG. 10C, the first supporter PT1-2 may include a first base supporter BP1 and a first light absorption part BC1-2 disposed on an outer surface of the first base supporter BP1. The second supporter PT2-2 may include a second base supporter BP2 and a second light absorption part BC2-2 disposed on an outer surface of the second base supporter BP2.

The first light absorption part BC1-2 may be disposed on the top surface S-T of the first base supporter BP1 and may not be disposed on the bottom surface S-B and the side surface S-S of the first base supporter BP1. The second light absorption part BC2 may be disposed on the top surface S-T of the second base supporter BP2 and many not be disposed on the bottom surface S-B and the side surface S-S of the second base supporter BP2.

In this embodiment, the first light absorption parts BC1, BC1-1, and BC1-2 and the second light absorption parts BC2, BC2-1, and BC2-2 may be disposed on the entire surface of the top surface S-T. This is done because, if a portion of the top surface S-T of the first base supporter BP1 and the top surface S-T of the second base supporter BP2, on which the first light absorption parts BC1, BC1-1, and BC1-2 or the second light absorption parts BC2, BC2-1, and BC2-2 are not disposed, exist, defects in which the portion has display quality different from that of the other portion may occur.

Referring to FIGS. 9A, 9B, 10A, 10B, and 10C, the display quality of a portion of the display area DA, which corresponds to the bending axis BX, may be different from that of the other portion of the display area DA due to the spaced distance DT between the first supporter PT1 and the second supporter PT2.

Thus, as illustrated in FIGS. 10A to 10C, when the first light absorption parts BC1, BC1-1, and BC1-2 or the second light absorption parts BC2, BC2-1, and BC2-2 are disposed on the outer surfaces of the first base supporter BP1 and the second base supporter BP2, the transmission or reflection of light by the first light absorption parts BC1, BC1-1, and BC1-2 or the second light absorption parts BC2, BC2-1, and BC2-2 may be restricted so that the display area DA has uniform display quality.

Figure 11A:
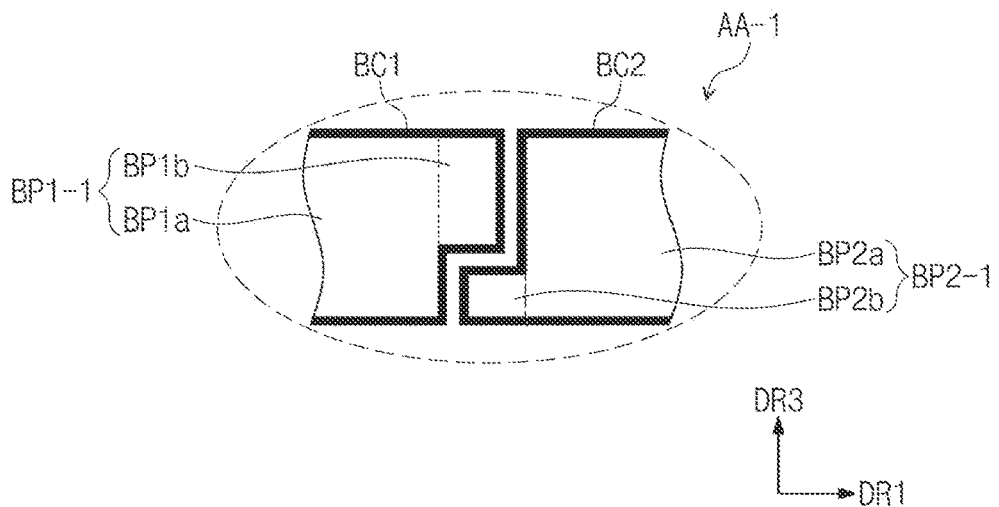
FIGS. 11A-11C are views illustrating a modified example of a portion AA of FIG. 9A.
Figure 11B:
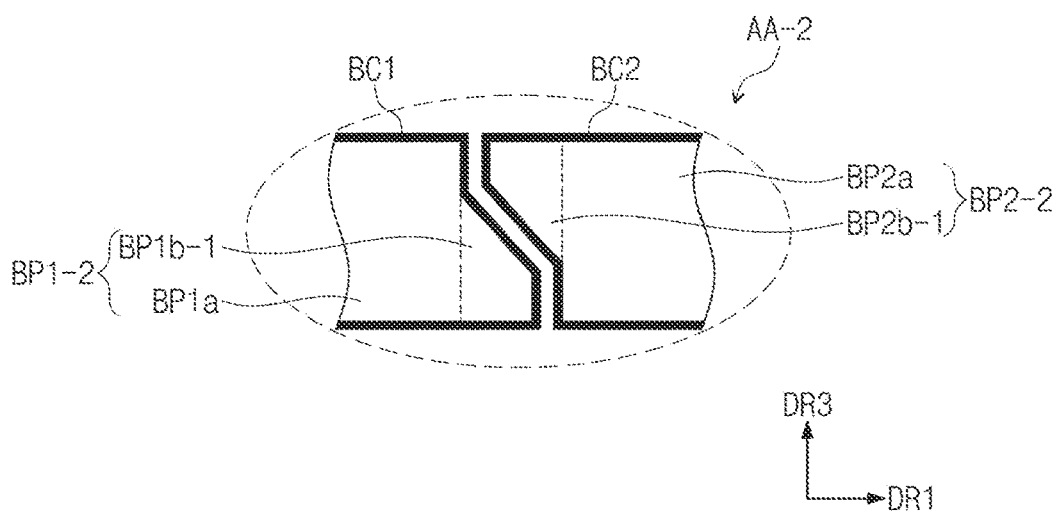
Figure 11C:
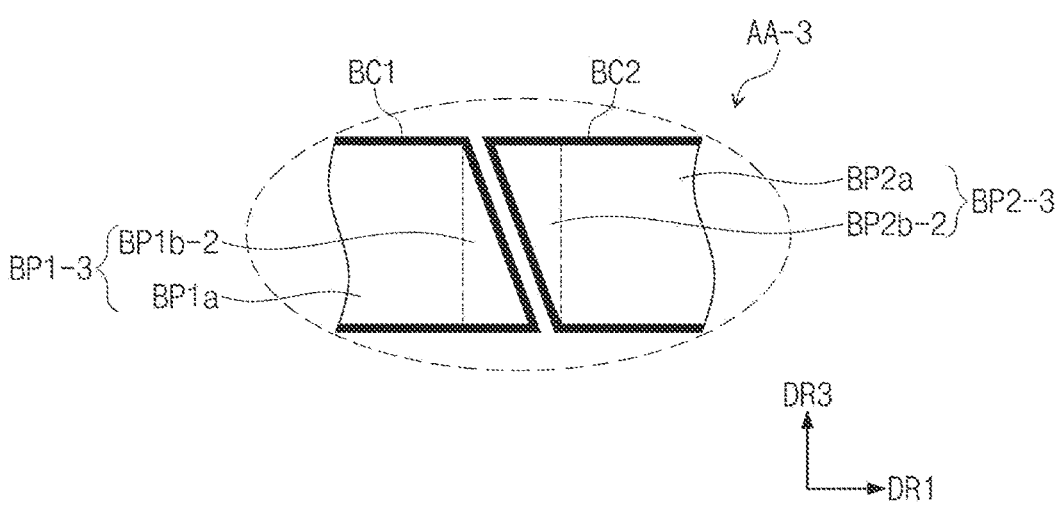

FIGS. 11A, 11B, and 11C are views illustrating modified examples AA-1, AA-2, and AA-3 of a portion AA of FIG. 9A, respectively Referring to FIG. 11A, a first base supporter BP1-1 may include a first body part BP1a and a first protrusion BP1b extending from the first body part BP1a. A second base supporter BP2-1 may include a second body part BP2a and a second protrusion BP2b extending from the second body part BP2a.

Referring to FIG. 11B, a first base supporter BP1-2 may include a first body part BP1a and a first protrusion BP1b-1 extending from the first body part BP1a. A second base supporter BP2-2 may include a second body part BP2a and a second protrusion BP2b-1 extending from the second body part BP2a.

Referring to FIG. 11C, a first base supporter BP1-3 may include a first body part BP1a and a first protrusion BP1b-2 extending from the first body part BP1a. A second base supporter BP2-3 may include a second body part BP2a and a second protrusion BP2b-2 extending from the second body part BP2a.

A length of each of the first protrusions BP1b, BP1b-1, and BP1b-2 in the third direction DR3 is less than that of the first body part BP1a in the third direction DR3. A length of each of the second protrusions BP2b, BP2b-1, and BP2b-2 in the third direction DR3 is less than that of the first body part BP2a in the third direction DR3.

The first protrusions BP1b, BP1b-1, and BP1b-2 and the second protrusions BP2b, BP2b-1, and BP2b-2 overlap each other in the third direction DR3. Since the first protrusions BP1b, BP1b-1, and BP1b-2 and the second protrusions BP2b, BP2b-1, and BP2b-2 overlap each other, the transmission and reflection of the light in the third direction DR3 may be more effectively restricted.

Referring to FIGS. 11B and 11C,the length of each of the first protrusions BP1b, BP1b-1, and BP1b-2 and the second protrusions BP2b, BP2b-1, and BP2b-2 in the third direction may gradually decrease or increase. For example, a shape of a cross-section of each of the first protrusion BP1b-1 and the second protrusion BP2b-1 may be trapezoidal as illustrated in FIG. 11B. In some examples, a shape of a cross-section of each of the first protrusion BP1b-2 and the second protrusion BP2b-2 may be triangular as illustrated in FIG. 11C.

Figure 12:
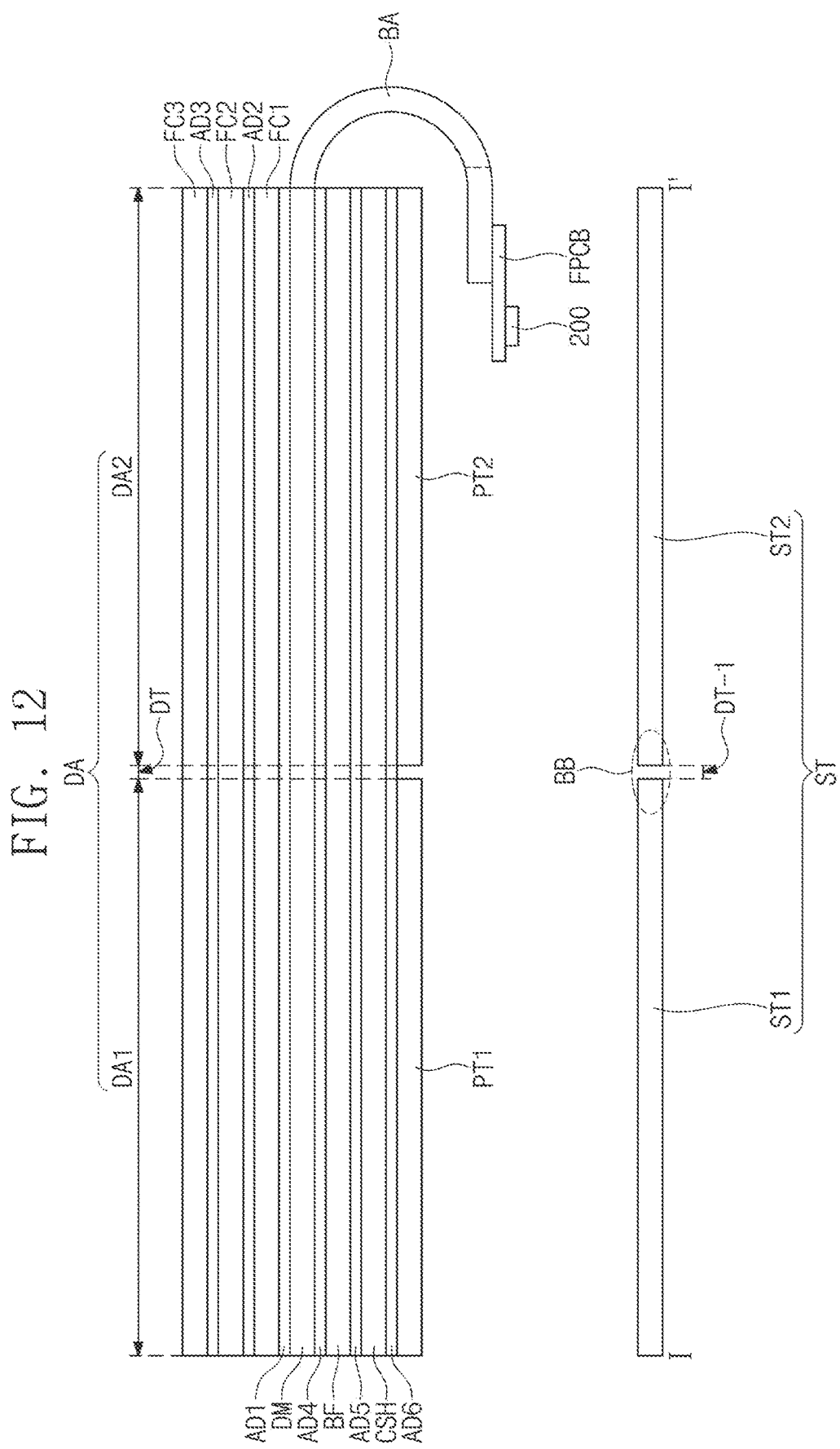
FIG. 12 is a partial cross-sectional view taken along the line I-I' of FIG. 1.

FIG. 12 is a partial cross-sectional view taken along the line I-I' of FIG. 1. In FIG. 12, a set member ST is additionally illustrated in the shape illustrated in FIG. 9A. The set member ST may be a portion of a housing HS of FIG. 1.

In another embodiment of the inventive concept, the sixth adhesive AD6 and the supporter PT of the components of FIG. 12 may be omitted.

The set member ST may include a first set member ST1 and a second set member ST2. The first set member ST1 overlaps the first display area DA1 in the third direction DR3, and the second set member ST2 overlaps the second display area DA2 in the third direction DR3.

Figure 13A:
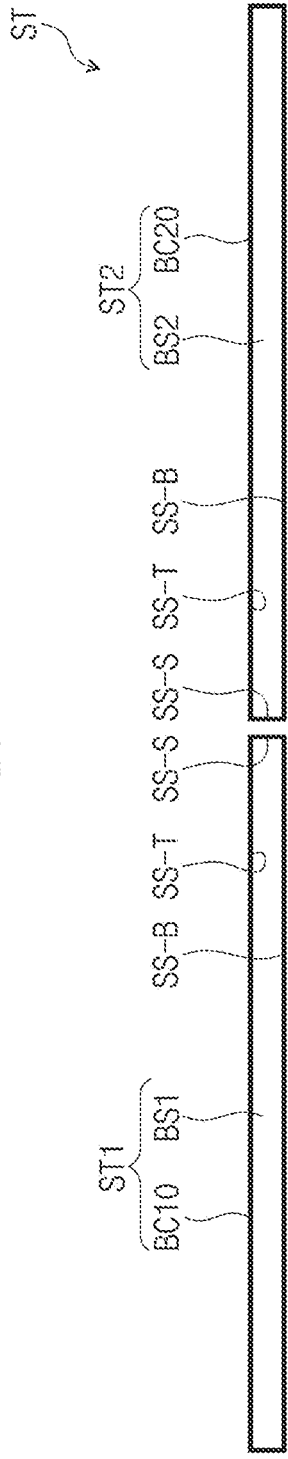
FIGS. 13A-13C are views illustrating an example of a set member according to an embodiment of the inventive concept.
Figure 13B:
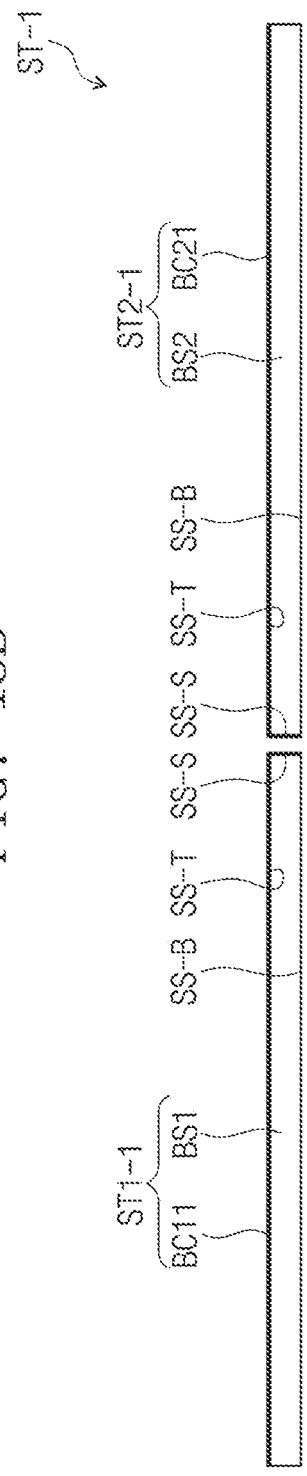
Figure 13C:
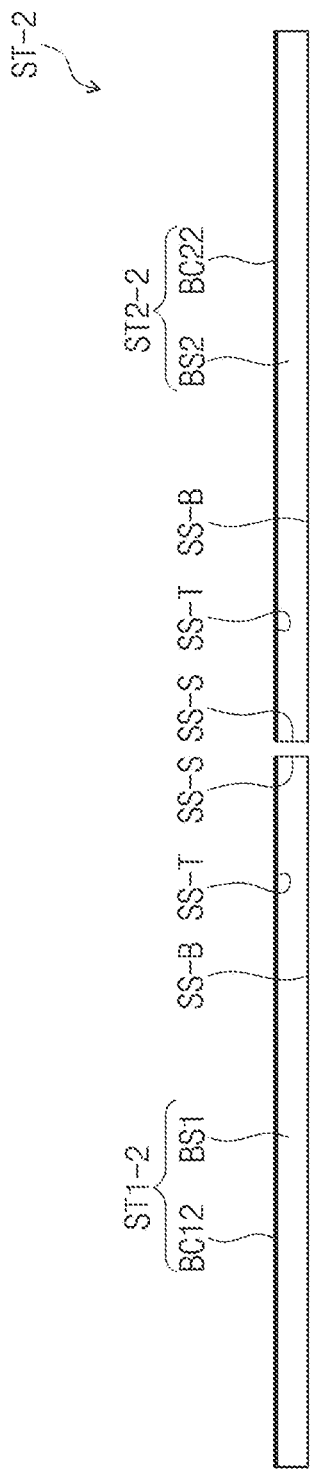

FIGS. 13A, 13B, and 13C are views illustrating examples of set members ST, ST-1, and ST1-2 according to an embodiment of the inventive concept, respectively.

Referring to FIG. 13A, the first set member ST1 may include a first base set member BS1 and a first light absorption part BC10 disposed on an outer surface of the first base set member BS1. The second set member ST2 may include a second base set member BS2 and a second light absorption part BC20 disposed on an outer surface of the second base set member BS2.

Each of the first base set member BS1 and the second base set member BS2 may include a metal. However, this is merely an example. For example, in an embodiment of the inventive concept, each of the first base set member BS1 and the second base set member BS2 may include a synthetic resin.

Each of the first base set member BS1 and the second base set member BS2 may have a rigid property.

Each of the first base set member BS1 and the second base set member BS2 may include a top surface SS-T, a bottom surface SS-B facing the top surface SS-T, and a side surface SS-S connecting the top surface SS-T to the bottom surface SS-B.

The first light absorption part BC10 and the second light absorption part BC20 may be configured to prevent or substantially prevent light from being transmitted or reflected and may have a black color.

In an embodiment of the inventive concept, the first light absorption part BC10 and the second light absorption part BC20 may be applied to the first base set member BS1 and the second base set member BS2, respectively.

The first light absorption part BC10 may be disposed on all of the top surface SS-T, the bottom surface SS-B, and the side surface SS-S of the first base set member BS1. The second light absorption part BC20 may be disposed on all of the top surface SS-T, the bottom surface SS-B, and the side surface SS-S of the second base set member BS2.

Referring to FIG. 13B, the first set member ST1-1 may include a first base set member BS1 and a first light absorption part BC11 disposed on an outer surface of the first base set member BS1. The second set member ST2-1 may include a second base set member BS2 and a second light absorption part BC21 disposed on an outer surface of the second base set member BS2.

The first light absorption part BC11 may be disposed on at least a portion of the top surface SS-T and the side surface SS-S of the first base set member BS1 and may not be disposed on the bottom surface SS-B. The second light absorption part BC21 may be disposed on at least a portion of the top surface SS-T and the side surface SS-S of the second base set member BS2 and may not be disposed on the bottom surface SS-B.

In addition, other descriptions with respect to FIG. 13B are substantially the same as those described in reference to FIG. 13A and thus may be omitted.

Referring to FIG. 13C, the first set member ST1-2 may include a first base set member BS1 and a first light absorption part BC12 disposed on an outer surface of the first base set member BS1. The second set member ST2-2 may include a second base set member BS2 and a second light absorption part BC22 disposed on an outer surface of the second base set member BS2.

The first light absorption part BC12 may be disposed on the top surface SS-T of the first base support set BS1 and may not be disposed on the bottom surface SS-B and the side surface SS-S of the first base set member BS1. The second light absorption part BC22 may be disposed on the top surface SS-T of the second base set member BS2 and many not be disposed on the bottom surface SS-B and the side surface SS-S of the second base set member BS2.

In this embodiment, the first light absorption parts BC10, BC11, and BC12 and the second light absorption parts BC20, BC21, and BC22 may be disposed on the entire surface of the top surface SS-T. This is done because, if a portion of the top surface SS-T of the first base set member BS1 and the top surface SS-T of the second base set member BS2, on which the first light absorption parts BC10, BC11, and BC12 or the second light absorption parts BC20, BC21, and BC22 are not disposed, exist, defects in which the portion has display quality different from that of the other portion may occur.

That is, the effects occurring by the first light absorption parts BC10, BC11, and BC12 or the second light absorption parts BC20, BC21, and BC22, which are described with reference to FIGS. 13A to 13C, may be substantially the same as those occurring by the first light absorption parts BC1, BC1-1, and BC1-2 or the second light absorption parts BC2, BC2-1, and BC2-2, which are described with reference to FIGS. 10A to 10C.

Figure 14A:
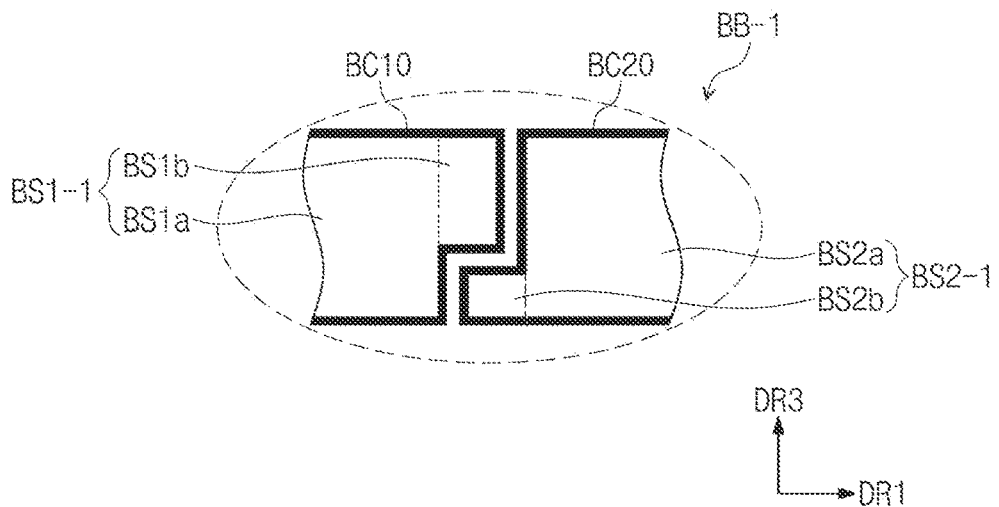
FIGS. 14A-14C are views illustrating a modified example of a portion BB of FIG. 12, respectively.
Figure 14B:
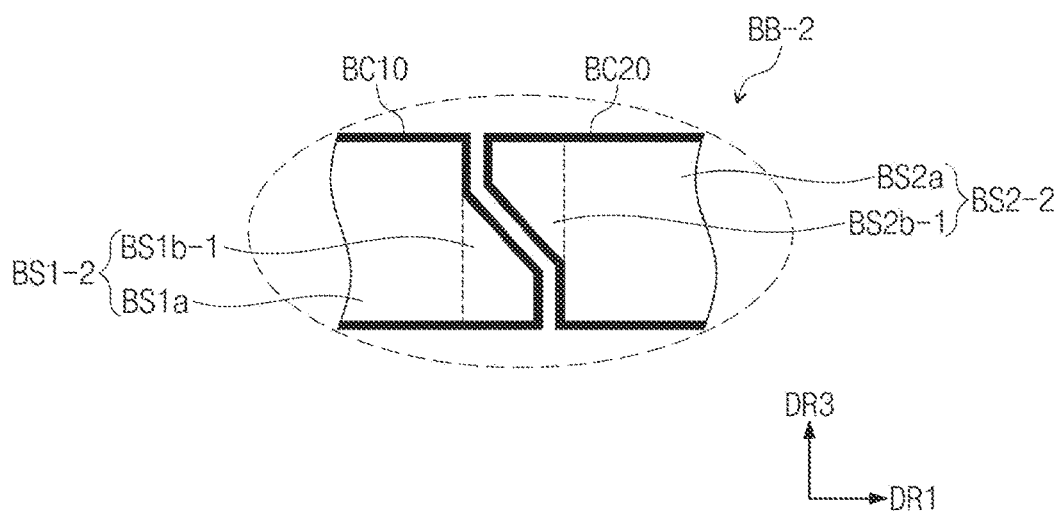
Figure 14C:
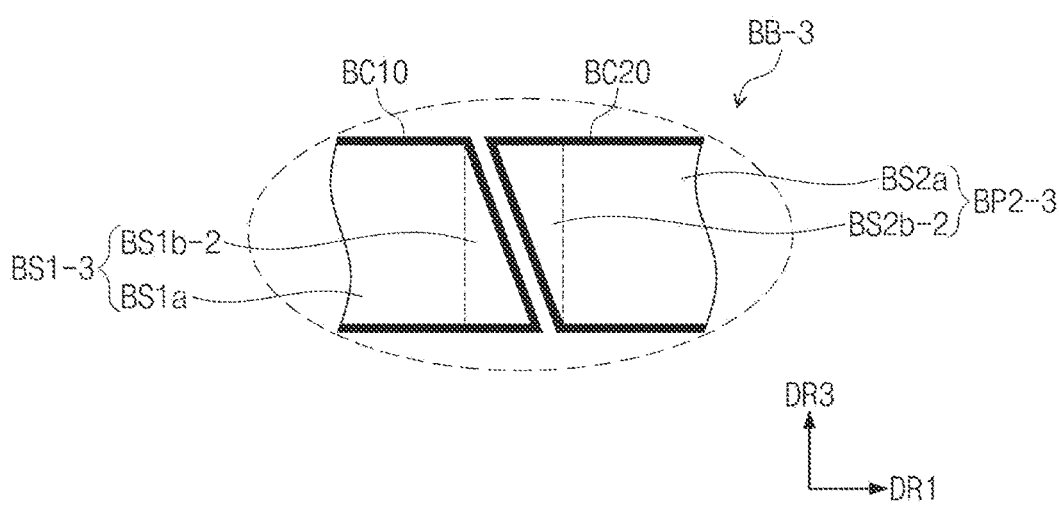

FIGS. 14A, 14B, and 14C are views illustrating modified examples BB-1, BB-2, and BB-3 of a portion BB of FIG. 12A, respectively.

Referring to FIG. 14A, a first base set member BS1-1 may include a first set body part BS1$a$ and a first set protrusion BS1$b$ extending from the first set body part BS1$a$. A second base set member BS2-1 may include a second set body part BS2$a$ and a second protrusion BS2$b$ extending from the second set body part BS2$a$.

Referring to FIG. 14B, a first base set member BS1-2 may include a first set body part BS1$a$ and a first protrusion BS1$b$-1 extending from the first set body part BS1$a$. A second base set member BS2-2 may include a second set body part BS2$a$ and a second protrusion BS2$b$-1 extending from the second set body part BS2$a$.

Referring to FIG. 14C, a first base set member BS1-3 may include a first set body part BS1$a$ and a first protrusion BS1$b$-2 extending from the first set body part BS1$a$. A second base set member BS2-3 may include a second set body part BS2$a$ and a second protrusion BS2$b$-2 extending from the second set body part BS2$a$.

A length of each of the first protrusions BS1$b$, BS1$b$-1, and BS1$b$-2 in the third direction DR3 is less than that of the first set body part BS1$a$ in the third direction DR3. A length of each of the second protrusions BS2$b$, BS2$b$-1, and BS2$b$-2 in the third direction DR3 is less than that of the first set body part BS2$a$ in the third direction DR3.

The first protrusions BS1$b$, BS1$b$-1, and BS1$b$-2 and the second protrusions BS2$b$, BS2$b$-1, and BS2$b$-2 overlap each other in the third direction DR3. Since the first protrusions BS1$b$, BS1$b$-1, and BS1$b$-2 and the second protrusions BS2$b$, BS2$b$-1, and BS2$b$-2 overlap each other, the transmission and reflection of the light in the third direction DR3 may be more effectively restricted.

Referring to FIGS. 11B and 11C, the length of each of the first set protrusions BS1$b$-1 and BS1$b$-2 and the second set protrusions BS2$b$-1 and BS2$b$-2 in the third direction may gradually decrease or increase. For example, a shape of a cross-section of each of the first protrusion BP1$b$-1 and the second protrusion BP2$b$-1 may be trapezoidal as illustrated in FIG. 11B. In some examples, a shape of a cross-section of each of the first set protrusion BS1$b$-2 and the second set protrusion BS2$b$-2 may be triangular as illustrated in FIG. 14C.

FIGS. 15A, 15B, and 15C are views illustrating examples of supporters PT-3, PT-4, and PT-5 according to an embodiment of the inventive concept, respectively.

Referring to FIG. 15A, the supporter PT-3 may include a first supporter PT1-3 and a second supporter PT2-3.

The first supporter PT1-3 may include a first base supporter BP1 and a first diffused reflection member RC1 disposed on an outer surface of the first base supporter BP1. The second supporter PT2-3 may include a second base supporter BP2 and a second diffused reflection member RC2 disposed on an outer surface of the second base supporter BP2.

The first diffused reflection member RC1 and the second diffused reflection member RC2 may reflect incident light in various directions to prevent the light from being concentrated into one side. That is, the first diffused reflection member RC1 and the second diffused reflection member RC2 may diffusely reflect the incident light.

In an embodiment of the inventive concept, the first diffused reflection member RC1 and the second diffused reflection member RC2 may be applied to the first base supporter BP1 and the second base supporter BP2, respectively.

As described above, the first diffused reflection member RC1 and the second diffused reflection member RC2 may be applied to the first base supporter BP1 and the second base supporter BP2 so that a boundary between the first base supporter BP1 and the second base supporter BP2 is invisible.

The first diffused reflection member RC1 may be disposed on all of the top surface S-T, the bottom surface S-B, and the side surface S-S of the first base supporter BP1. The second diffused reflection member RC2 may be disposed on all of the top surface S-T, the bottom surface S-B, and the side surface S-S of the second base supporter BP2.

Referring to FIG. 15B, the supporter PT1-4 may include a first supporter PT1-4 and a second supporter PT2-4.

The first supporter PT1-4 may include a first base supporter BP1 and a first diffused reflection member RC1-1 disposed on an outer surface of the first base supporter BP1. The second supporter PT2-4 may include a second base supporter BP2 and a second diffused reflection member RC2-1 disposed on an outer surface of the second base supporter BP2.

The first diffused reflection member RC1-1 may be disposed on at least a portion of the top surface S-T and the side surface S-S of the first base supporter BP1 and may not be disposed on the bottom surface S-B. The second diffused reflection member RC2-1 may be disposed on at least a portion of the top surface S-T and the side surface S-S of the second base supporter BP2 and may not be disposed on the bottom surface S-B.

In addition, other descriptions with respect to FIG. 15B are substantially the same as those described in reference to FIG. 15A and thus may be omitted.

Referring to FIG. 15C, the supporter PT-5 may include a first supporter PT1 and a second supporter PT2.

The first supporter PT1-5 may include a first base supporter BP1 and a first diffused reflection member RC1-2 disposed on an outer surface of the first base supporter BP1. The second supporter PT2-5 may include a second base supporter BP2 and a second diffused reflection member RC2-2 disposed on an outer surface of the second base supporter BP2.

The first diffused reflection member RC1-2 may be disposed on the top surface S-T of the first base supporter BP1 and may not be disposed on the bottom surface S-B and the side surface S-S of the first base supporter BP1. The second diffused reflection member RC2-2 may be disposed on the top surface S-T of the second base supporter BP2 and many not be disposed on the bottom surface S-B and the side surface S-S of the second base supporter BP2.

In addition, other descriptions with respect to FIG. 15C are substantially the same as those described in reference to FIG. 15A and thus may be omitted.

In FIGS. 15A to 15C, the diffused reflection member are substitute for the light absorption part of FIGS. 10A to 10C. However, the embodiments of the inventive concept are not limited thereto. For example, the diffused reflection member may also be substitute for the light absorption part of FIGS. 11 to 14C.

According to the embodiment of the inventive concept, in the display device that is foldable with respect to the folding axis, the portion corresponding to the folding axis and other portions except for the portion corresponding to the folding axis may have the uniform display quality.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like, Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
   a flexible display module having thereon a first display area and a second display area adjacent to the first display area, the flexible display module being foldable with respect to a boundary between the first display area and the second display area; and
   a supporter comprising a first supporter overlapping the first display area and a second supporter overlapping the second display area and below the flexible display module,
   the first supporter comprising:
      a first base supporter; and
      a first diffused reflection part on an outer surface of the first base supporter, and
   the second supporter comprising:
      a second base supporter; and
      a second diffused reflection part on an outer surface of the second base supporter.

2. The display device of claim 1, wherein each of the first diffused reflection part and the second diffused reflection part is to diffusely reflect an incident light.

3. The display device of claim 2, wherein each of the first base supporter and the second base supporter has a rigid property.

4. The display device of claim 3, wherein each of the first base supporter and the second base supporter comprises a metal.

5. The display device of claim 1, wherein the first diffused reflection part is coated on the first base supporter, and the second diffused reflection part is coated on the second base supporter.

6. The display device of claim 1, further comprising:
   an impact absorption part below the flexible display module; and
   an adhesive below the impact absorption part,
   wherein each of the first supporter and the second supporter is coupled to the impact absorption part by the adhesive.

7. The display device of claim 1, wherein the flexible display module comprises:
   a flexible display panel comprising a plurality of pixels, each of the plurality of pixels comprises an organic light emitting diode, and the flexible display panel further comprising a driving circuit configured to provide a data signal to the plurality of pixels; and
   an input sensing circuit on the flexible display panel.

8. The display device of claim 7, wherein the driving circuit is below the supporter.

9. The display device of claim 1,
   wherein the first base supporter comprises:
      a first body part; and
      a first protrusion extending from the first body part, and
   wherein the second base supporter comprises:
      a second body part; and
      a second protrusion extending from the second body part and overlapping the first protrusion.

10. The display device of claim 1, wherein each of the first base supporter and the second base supporter has:
    a top surface;
    a bottom surface facing the top surface; and
    a side surface connecting the top surface to the bottom surface, and
    wherein each of the first diffused reflection part and the second diffused reflection part is on an entirety of the top surface corresponding thereto.

11. The display device of claim 10, wherein each of the first diffused reflection part and the second diffused reflection part is further on at least a portion of the side surface corresponding thereto.

12. The display device of claim 10, wherein each of the first diffused reflection part and the second diffused reflection part is on the side surface corresponding thereto and an entire bottom surface corresponding thereto.

13. The display device of claim 1, further comprising:
    a set part comprising a first set part below the first supporter and a second set part below the second supporter,
    wherein the first set part comprises:
       a first base set part having a rigid property; and
       a third light absorption part on an outer surface of the first base set part, and
    wherein the second set part comprises:
       a second base set part having a rigid property; and
       a fourth light absorption part on an outer surface of the second base set part.

14. The display device of claim 13, wherein the flexible display module comprises a plurality of pixels, each of the plurality of pixels comprising an organic light emitting diode, and the flexible display module further comprises a driving circuit configured to provide a data signal to the plurality of pixels, and
    wherein the driving circuit is between the set part and the supporter.

15. The display device of claim 14, wherein each of the third light absorption part and the fourth light absorption part has a black color, and
    wherein each of the first base set part and the second base set part comprises a metal.

* * * * *